(12) United States Patent
Kanzaki et al.

(10) Patent No.: US 9,545,020 B2
(45) Date of Patent: Jan. 10, 2017

(54) ELECTRONIC CONTROL DEVICE

(71) Applicant: Mitsubishi Electric Corporation, Tokyo (JP)

(72) Inventors: Shozo Kanzaki, Tokyo (JP); Fumiaki Arimai, Tokyo (JP); Hiroyoshi Nishizaki, Tokyo (JP); Masato Nakanishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 21 days.

(21) Appl. No.: 14/682,163

(22) Filed: Apr. 9, 2015

(65) Prior Publication Data

US 2016/0128215 A1 May 5, 2016

(30) Foreign Application Priority Data

Oct. 30, 2014 (JP) ................................ 2014-221056

(51) Int. Cl.
*H05K 7/00* (2006.01)
*H05K 5/00* (2006.01)

(52) U.S. Cl.
CPC .......... *H05K 5/0082* (2013.01); *H05K 5/0069* (2013.01)

(58) Field of Classification Search
CPC ............ H01L 2224/48091; H01L 2924/19041; H01L 2924/01079; G02B 6/4249; G06F 1/181; G06F 1/1632; G06F 1/1656
USPC ....................................................... 361/728
See application file for complete search history.

(56) References Cited

U.S. PATENT DOCUMENTS

| 5,606,487 | A | * | 2/1997 | Yasukawa | ........... H01L 23/3735 |
| | | | | | 257/717 |
| 8,717,766 | B2 | * | 5/2014 | Arimai | ................... H05K 3/284 |
| | | | | | 257/706 |
| 9,237,662 | B2 | * | 1/2016 | Satake | .................. H01L 23/057 |
| 2004/0084756 | A1 | * | 5/2004 | Kawakami | .......... H01L 21/4842 |
| | | | | | 257/666 |
| 2007/0051596 | A1 | | 3/2007 | Kanno et al. | |
| 2010/0327654 | A1 | * | 12/2010 | Azuma | .................... B60L 11/04 |
| | | | | | 307/9.1 |
| 2011/0007478 | A1 | * | 1/2011 | Takahashi | ........... H01L 23/3121 |
| | | | | | 361/721 |

(Continued)

FOREIGN PATENT DOCUMENTS

JP 2012-002242 A 1/2012
WO 2005/050805 A1 6/2005

*Primary Examiner* — Hung S Bui
(74) *Attorney, Agent, or Firm* — Sughrue Mion, PLLC; Richard C. Turner

(57) ABSTRACT

A control unit is stored in an airtight housing constituted by a base, an annular peripheral wall member, a cover, and first and second interior packings, second wiring conductors connected to input/output equipment and first wiring conductors connected to a host controller through a control signal connector are brought into press-contact with input/output control terminals of the control unit by first and second pressing elastic mats, the relative positions of associated components are regulated by positioning pins passing through from the cover to the base, and the cover is opened by loosening blockade screws without causing an assembly dimension error or sliding wear of conductive contact portions due to thermal deformation, whereby the control unit is detached.

21 Claims, 23 Drawing Sheets

(56) References Cited

U.S. PATENT DOCUMENTS

2012/0248094 A1* 10/2012 Strotmann ........... B23K 1/0016
  219/616
2014/0008780 A1* 1/2014 Tsujino ................. H01L 23/057
  257/690

* cited by examiner

ELECTRONIC CONTROL DEVICE

BACKGROUND OF THE INVENTION

Field of the Invention

The present invention relates to improvement of an electronic control device including a control unit stored in an airtight housing and wiring conductors connecting input/output control terminals provided in the control unit to input/output equipment outside the airtight housing.

Description of the Background Art

A mechanically and electrically integrated type electronic control device which is directly attached to a storage container of a transmission embedded with an actuator, such as a linear solenoid valve for hydraulic control or other electromagnetic valves, has been widely put into practical use. For example, referring to FIG. 1 of Patent Document 1 entitled "CONTROL MODULE", a control module 100 which is an electronic control device described herein has an ATCU 10 which is a control circuit unit (a control unit described herein), and a wiring unit 20 which connects a terminal of the control circuit unit and a connector 28. The control circuit unit 10 and the wiring unit 20 are stored between a cover 30 and a base 40. The wiring unit 20 has a resin-molded portion 24 in which the vicinity of the central portion of bus bars 22 made of a plurality of conductors is molded with resin. The resin-molded portion serves as a rigid body region and a portion where the bus bars are exposed serves as a flexible region.

The base 40 is shaped to be in contact with the cover 30 in a state where the cover 30 and the base 40 are fitted to each other, protrusions 42 are formed to be arranged between the bus bars 22 in the flexible region, and contact portions between the cover 30 and the protrusions 42 of the base 40 are fixed. In this way, a control module with improved productivity and workability is obtained.

According to FIGS. 1 and 4 of Patent Document 2 entitled "CONTROL DEVICE OF AUTOMATIC TRANSMISSION", a TCU 1 (a control unit described herein) is mounted on a metal plate (dissipation member) 2, a resin first housing 3 constituting a first wiring unit A and a second housing 4 constituting a second wiring unit B are fastened and fixed to the metal plate 2, a lead frame 9 arranged on the left side of the TCU 1 is connected to an external connector unit 16 for an engine control unit through a third terminal 10, and a lead frame 9 arranged on the right side of the TCU 1 is connected to a circuit board 7 of a sensor unit through a first terminal (relay terminal) 11 and a second terminal 12.

The lead frames 9 are connected to circuit patterns of the TCU 1 by bonding wires in advance, and portions exposed from sealing resin become lead terminals 31, the lead terminals 31 are bonded to the first terminal 11 and the third terminal 10 by laser welding, and the first terminal 11 and the second terminal 12 are bonded to each other by laser welding. Bent portions 32 or 34 and 35 for stress absorption are provided in the lead terminals 31 or the first to third terminals 9 to 11, and an insulating material 36 or 46 which is an insulating adhesive material is applied, thereby preventing the terminals from being short-circuited by a conductive foreign substance. With this, it is possible to reduce production cost with a small space, and to reliably insulate adjacent terminals from each other.

[Patent Document 1] International Publication No. 2005/050805 (FIG. 1, Abstract)

[Patent Document 2] JP-A-2012-002242 (FIGS. 1 and 4, Abstract, Paragraphs 0042 to 0046 and 0054 to 0060)

According to Patent Document 1, when assembling the control module 100 of this embodiment, a plurality of bus bars 22 of the wiring unit 20 are arranged between a plurality of protrusions 42 of the base 40, the ATCU 10 is stored inside a frame body 26 of the wiring unit 20, and one end of a plurality of bus bars 22 and conduction terminals 14 of the ATCU 10 are connected by weldbonding or the like.

The cover 30 is placed on the thus-obtained sub-assembly, the cover 30 and the base 40 are fitted to each other, and contact portions between the upper surfaces of the protrusions 42 of the base 40 and the lower surface of the cover 30 are welded.

Similarly, the upper surface and the lower surface of the frame body 26 are welded to the cover 30 and the base 40 in contact portions between the cover 30 and the base 40.

Accordingly, the input/output control terminals of the control unit and the wiring conductors described herein are welded, and the cover and the base constituting the airtight housing are welded. For this reason, a welding machine is required in the assembly line, and it is difficult to detach the assembled control unit in a nondestructive manner, whereby it is necessary to cut the cover and the base and to cut the welded terminal portion in order to perform maintenance and replacement.

According to Patent Document 2, the insulation materials 36 and 46 which are an insulating adhesive material are applied to conductive portions exposed from a molding resin material while excluding the concept of the airtight housing in which the cover and the base are weldbonded. Meanwhile, since the input/output control terminals of the control unit and the wiring conductors described herein are welded, a welding machine is required in the assembly line, and it is difficult to detach the assembled control unit in a nondestructive manner, whereby it is necessary to cut the cover and the base and to cut the welded terminal portion in order to perform maintenance and replacement.

There is a problem in that the work of applying the insulating adhesive material becomes inefficient, and it becomes difficult to disassemble the metal plate 2, the first housing 3, and the second housing 4.

SUMMARY OF THE INVENTION

An object of the invention is to provide an electronic control device in which a control unit, a connector for external connection, and wiring conductors connecting the control unit and the connector are stored in an airtight housing, having an advantage of easily performing assembly work in a simple assembly line without requiring a welding machine and enabling replacement of the control unit by disassembly and assembly.

An electronic control device according to an aspect of the invention includes a control unit which has a plurality of input/output control terminals provided on a circuit board with electronic components mounted thereon. The control unit communicates a control signal with a host controller through an input/output control terminal and a control signal connector and controls an actuator to be control-target equipment through the input/output control terminals and an input/output connector. Second wiring conductors in contact with the input/output control terminals to connect the input/output control terminals and the input/output connector, first wiring conductors in contact with the input/output control terminals to connect the input/output control terminals and the control signal connector, and the control unit are stored in a region surrounded by an annular peripheral wall member, a base covering one side of the annular peripheral wall member, and a cover covering the other side of the annular peripheral wall member. A first interior packing is interposed between the cover and the annular peripheral wall member, a second interior packing is interposed between the base and the annular peripheral wall member, a first pressing elastic mat which presses contact portions between the input/output control terminals and the first wiring conductors from the inner surface side of the cover and a second pressing elastic mat which presses contact portions between the input/output control terminals and the second wiring conductors from the inner surface side of the base are arranged, the cover, the base, and the annular peripheral wall member are fastened and fixed to one another by at least first fixing members.

The cover and the base are fastened to each other by the first fixing members, such that the cover, the first interior packing, the annular peripheral wall member, the second interior packing, and the base are fastened in a sealed state. The input/output control terminals and the second wiring conductors are brought into elastic contact with each other by the second pressing elastic mat, the input/output control terminals and the first wiring conductors are brought into elastic contact with each other by the first pressing elastic mat, the first interior packing and the second interior packing are non-adhesive elastic packings, if the cover is opened, the input/output control terminals, the second wiring conductors, and the first wiring conductors are separated from one another to detach the control unit, and the relative positions of the input/output control terminals, the second wiring conductors, and the first wiring conductors are regulated by positioning pins protruding from the cover or positioning pins protruding from the base.

As above, in the electronic control device according to the aspect of the invention, the control unit which has a plurality of input/output control terminals generated on the circuit board with the electronic components mounted thereon, the control signal connector, and the first and second wiring conductors are stored in an airtight space constituted by the cover, the base, and the annular peripheral wall member, the non-adhesive first and second interior packings are interposed between the annular peripheral wall member and the cover and between the annular peripheral wall member and the base and are fastened and fixed to each other by the first fixing members, the first fixing members bring the input/output control terminals into press-contact with the first and second wiring conductors through the first or second pressing elastic mat in contact with the inner surface of the cover or the base.

Therefore, the first fixing members are loosened to open the cover and to separate the conductive contact surface, whereby it is possible to detach the single control unit, to facilitate maintenance and inspection, and to make a replacement component unit inexpensive.

A welding machine is not required for the work of connecting the control unit and the wiring conductors, it is possible to perform assembly work in a simple assembly line, and since the relative position of the conductive contact surface is regulated by the positioning pins, it is possible to suppress sliding wear in the conductive contact surface due to expansion and contraction of the circuit board or the wiring conductors in practical use without causing an assembly dimension error.

The exposed conductive portions of the input/output control terminals and a plurality of connection conductors are separated from the inside of an actuator by the non-adhesive first and second interior packings, the occurrence of short-circuiting between terminals due to a conductive foreign substance included in gear oil or contact failure between contact surfaces due to a non-conductive foreign substance is prevented, and disassembly and assembly are facilitated.

The foregoing and other objects, feature, aspects, and advantages of the present invention will become more apparent from the following detailed description of the present invention when taken in conjunction with the accompanying drawings.

DETAILED DESCRIPTION OF THE INVENTION

Embodiment 1

(1) Detailed Description of Configuration

First, FIG. 1 which is an overall configuration diagram of an electronic control device according to Embodiment 1 of the invention and FIGS. 2A to 2C which are partial detail views of FIG. 1 will be described.

Figure 1:
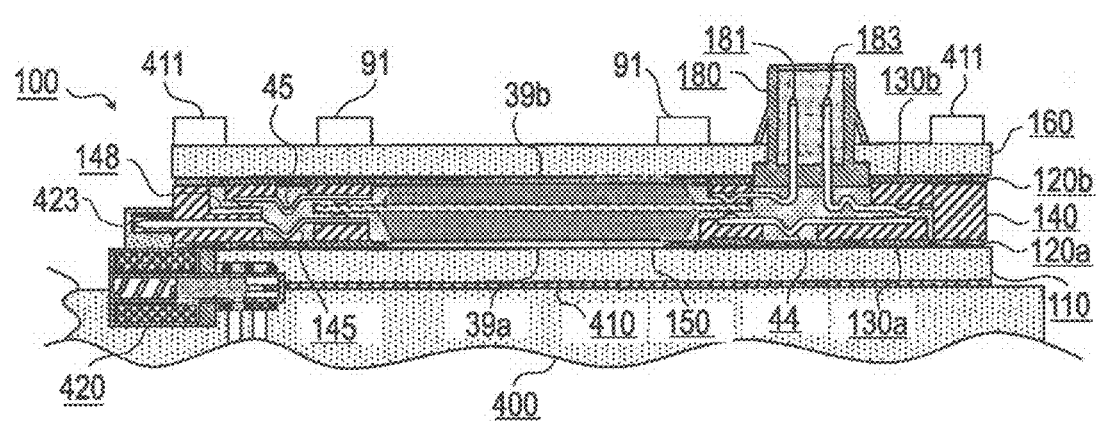
FIG. 1 is an overall configuration diagram of an electronic control device according to Embodiment 1 of the invention.

In FIG. 1, an electronic control device 100 primarily has, for example, an airtight housing constituted by a base 110 made of an aluminum die cast, an annular peripheral wall member 140 made of a resin molding material, and a cover 160 made of an aluminum die cast, and a control unit 150 stored in the airtight housing.

A first interior packing 120b is interposed between the cover 160 and the annular peripheral wall member 140, a second interior packing 120a is interposed between the base 110 and the annular peripheral wall member 140, and the first interior packing 120b and the second interior packing 120a are co-fastened and integrated by a plurality of blockade screws as first fixing members 91.

Figure 3:
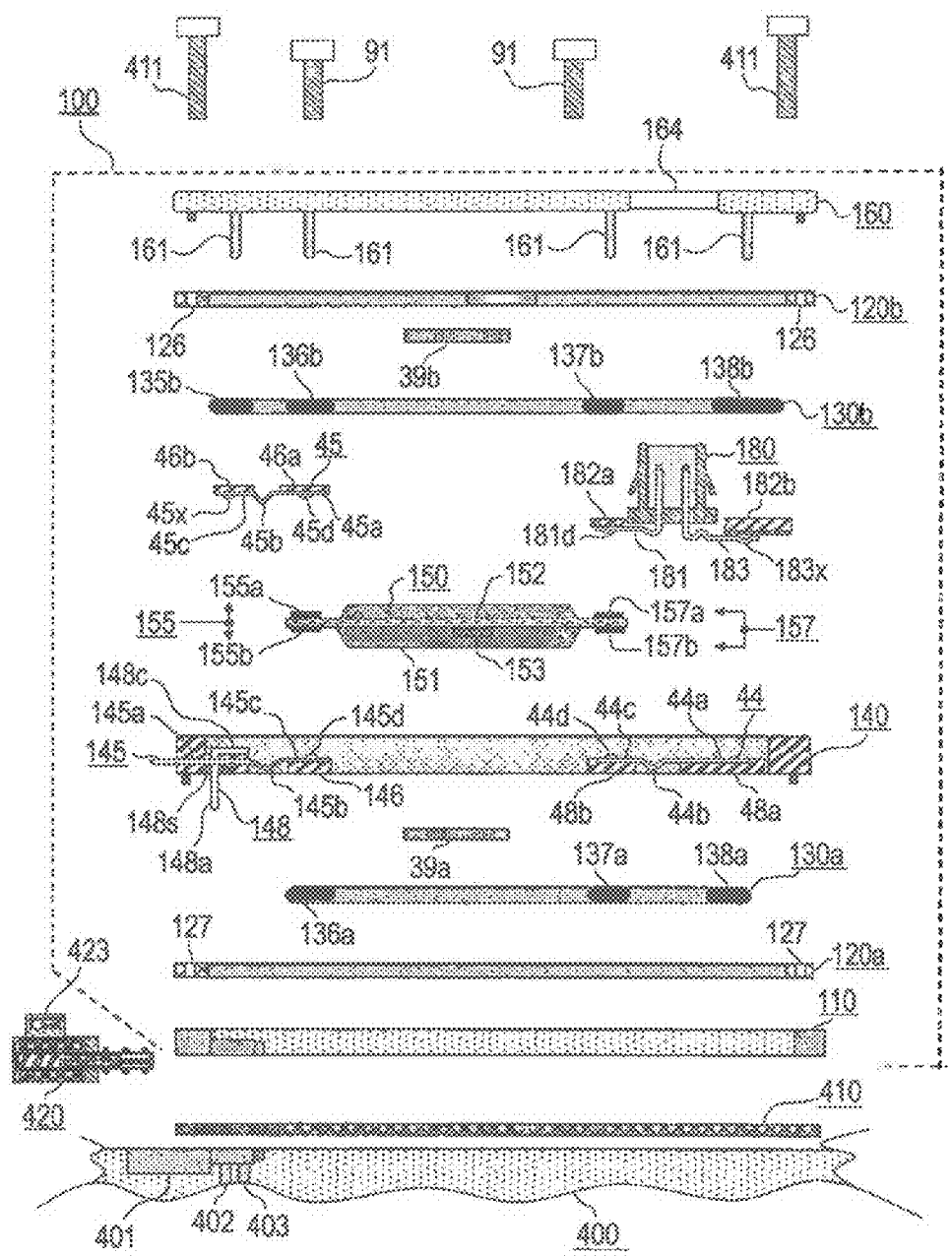
FIG. 3 is an exploded configuration diagram of the electronic control device of FIG. 1.

The embedded control unit 150 is elastically held between the cover 160 and the base 110 through thermally conductive first and second elastic holding mats 39b and 39a (see FIG. 3).

In the annular peripheral wall member 140, a plurality of second wiring conductors 145 described in detail referring to FIG. 7 and additional external terminals 148 described below referring to FIG. 3 are integrally molded.

Figure 13:
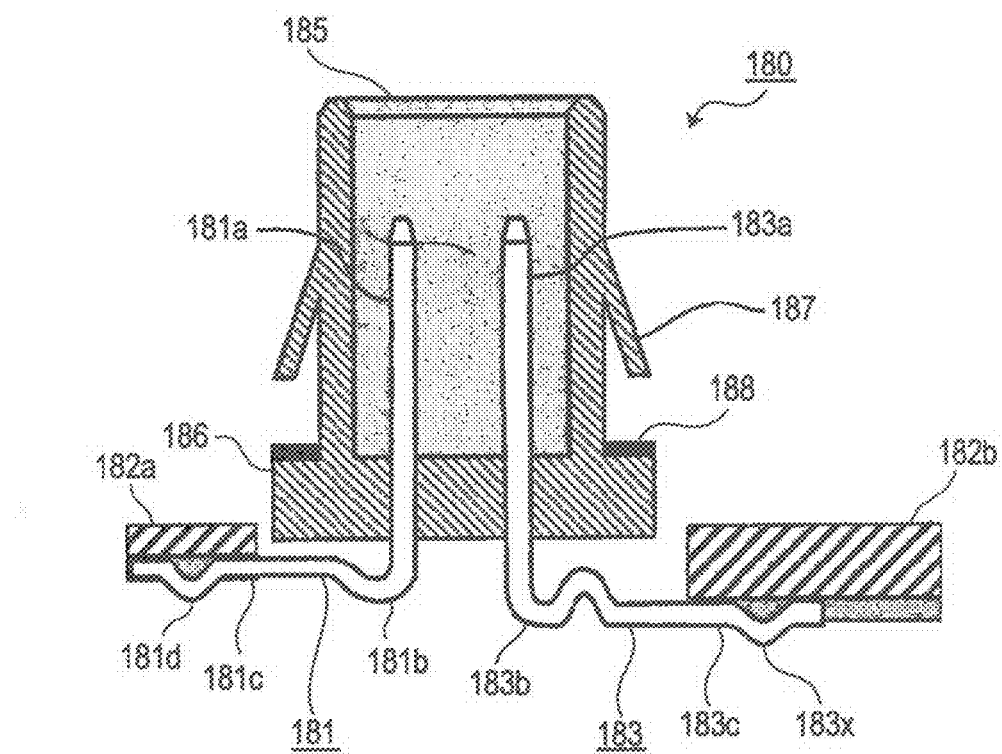
FIG. 13 is a sectional view of a control signal connector in the electronic control device of FIG. 1.

The cover 160 is provided with a control signal connector 180 described in detail referring to FIG. 13 to pass therethrough, and first wiring conductors 181 and additional wiring terminals 183 are integrally molded in the control signal connector 180.

The airtight housing integrated by the first fixing members 91 is attached and fixed to the attachment surface of an actuator 400 by a plurality of attachment screws which are second fixing members 411, and an exterior packing 410 is interposed between the attachment surface and the base 110.

The actuator 400 is, for example, an automatic transmission for an automobile, and is mounted with, for example, input/output equipment 420, such as a linear solenoid valve for hydraulic control, an on/off control electromagnetic valve for switching between hydraulic flow channels, a hydraulic sensor, or an oil temperature sensor.

Figure 12:
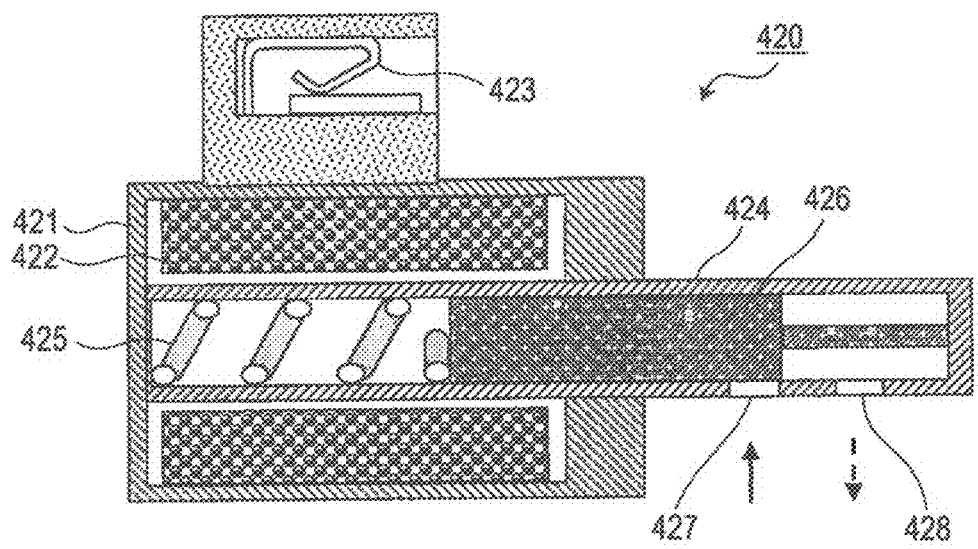
FIG. 12 is a sectional view showing an example of input/output equipment in combination outside the electronic control device of FIG. 1.

The input/output equipment 420 described herein is a hydraulic electromagnetic valve described in detail referring to FIG. 12, and the above-described first wiring conductors 145 are inserted into an input/output connector 423 provided in the input/output equipment 420.

Figure 2A:
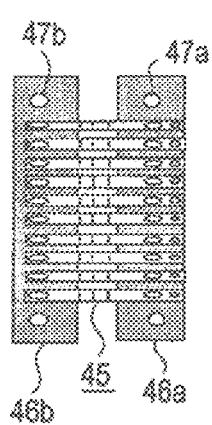
FIGS. 2A to 2C are partial detail views of a control unit and additional wiring conductors in the electronic control device of FIG. 1.
Figure 2B:
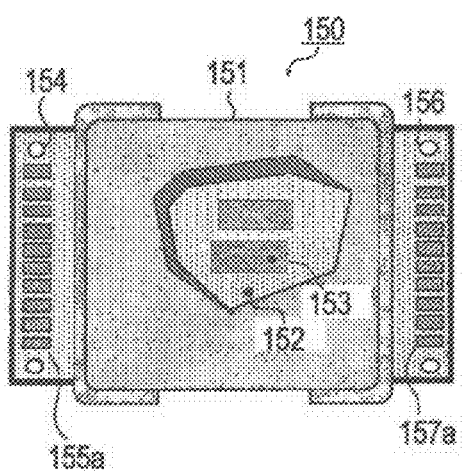

In FIG. 2B which is a plan view of the control unit 150, the control unit 150 which is, for example, an automatic transmission control device includes a circuit board 152 integrally molded by an exterior body 151 made of a resin molding material, and various electronic components 153 primarily including a microprocessor are mounted on the circuit board 152.

The left side and the right side of the circuit board 152 are exposed from the exterior body 151, input/output control terminals 155 and 157 which are copper foil patterns are generated in the exposed portions, and the input/output control terminals 155a and 157a on the front surface are shown.

A pair of positioning holes 154 and a pair of positioning holes 156 are provided at both ends of a plurality of input/output control terminals 155 and 157 arranged in a line on the right and left sides.

A plurality of positioning pins 161 described below are provided to be erect in the cover 160, and the positioning pins 161 are fitted into the pairs of positioning holes 154 and 156, thereby regulating the attachment plane position of the control unit 150.

In FIG. 2A which is a plan view of the additional wiring conductors 45 shown in FIG. 1, one end of a plurality of additional wiring conductors 45 is aligned and integrated by a first resin molded body 46a, the other end of a plurality of additional wiring conductors 45 is aligned and integrated by a second resin molded body 46b, a pair of pin through holes 47a are provided at both ends of the first resin molded body 46a, and a pair of pin through holes 47b are provided at both ends of the second resin molded body 46b.

The input/output control terminals 155a provided on the front surface of the circuit board 152 are connected to the pressed contact portions of the additional external terminals 148 through a plurality of additional wiring conductors 45.

Figure 2C:
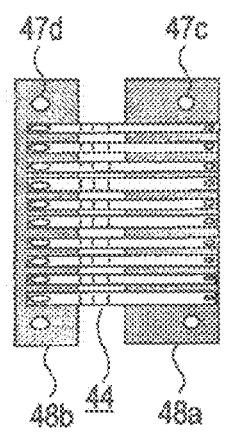

In FIG. 2C which is a plan view of additional wiring conductors 44 shown in FIG. 1, one end of a plurality of additional wiring conductors 44 is aligned and integrated by a first resin molded body 48a, the other end of a plurality of additional wiring conductors 44 is aligned and integrated by a second resin molded body 48b, a pair of pin through holes 47c are provided at both ends of the first resin molded body 48a, and a pair of pin through holes 47d are provided at both ends of the second resin molded body 48b.

Input/output control terminals 155b provided on the rear surface of the circuit board 152 are connected to the pressed contact portions of the additional wiring terminals 183 through a plurality of additional wiring conductors 44.

A first pressing elastic mat 130b is arranged on the inner surface of the cover 160, and a second pressing elastic mat 130a is arranged on the inner surface of the base 110. The first pressing elastic mat 130b and the second pressing elastic mat 130a are compressed by fastening the first fixing members 91 and are brought into press-contact with the input/output control terminals 155 and 157 or conductive contact portions in other pressed contact portions.

Next, FIG. 3 which is an exploded configuration diagram of the electronic control device 100 will be described in detail referring to partial detail views of FIGS. 4 to 13.

Figure 4:
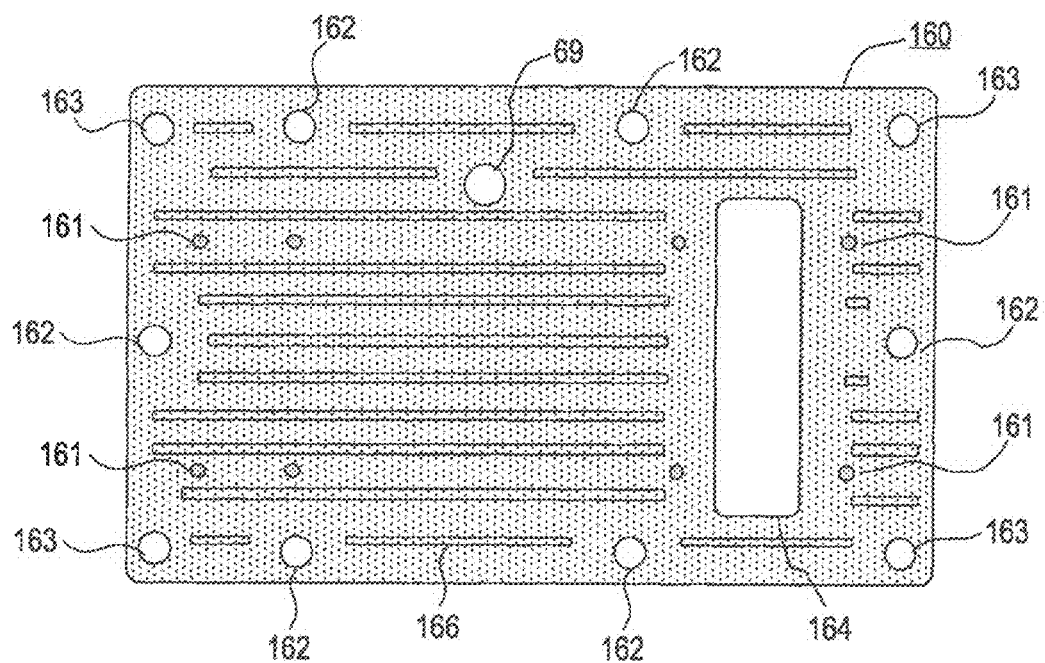
FIG. 4 is a plan view of a cover in the electronic control device of FIG. 1.

In FIGS. 3 and 4, the cover 160 constituting the electronic control device 100 is provided with a plurality of positioning pins 161 press-fitted and fixed, a plurality of bolt through holes 162 through which the first fixing members 91 pass, a plurality of bolt through holes 163 through which the second fixing members 411 pass, a connector window hole 164 through which the control signal connector 180 passes, a plurality of heat dissipation ribs 166 provided for heat dissipation, and a second air pressure adjustment window 69 described below referring to FIGS. 8A to 8D.

Figure 5:
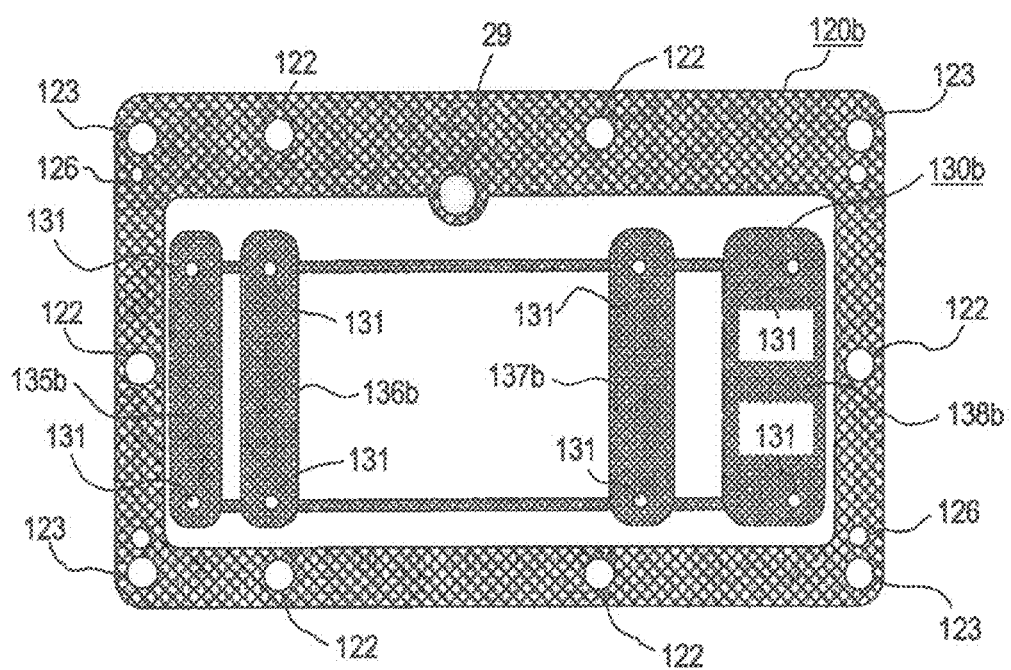
FIG. 5 is a plan view of a first interior packing and a first pressing elastic mat in the electronic control device of FIG. 1.

In FIGS. 3 and 5, the first interior packing 120b is provided with a plurality of bolt through holes 122 through which the first fixing members 91 pass, a plurality of bolt through holes 123 through which the second fixing members 411 pass, and an air pressure adjustment film 29 described below referring to FIGS. 8A to 8D.

First fitting portions 126 are provided at four corners of the first interior packing 120b, and fitting protrusions (not shown) provided at four corners of the cover 160 are fitted into the first fitting portions 126, thereby regulating the attachment position of the first interior packing 120b to the cover 160. The height of the fitting protrusions is lower than the dimension after compression of the first interior packing 120b.

The first pressing elastic mat 130b is integrally constituted by a plurality of pin through holes 131 through which the positioning pins 161 pass, an elastic mat member 135b which presses the second resin molded body 46b of the additional wiring conductors 45, an elastic mat member 136b which presses the first resin molded body 46a of the additional wiring conductors 45, an elastic mat member 137b which presses a divided resin molded body 182a provided in the pressed contact portions of the first wiring conductors 181, and an elastic mat member 138b which presses a divided resin molded body 182b provided in the pressed contact portions of the additional wiring terminals 183.

In FIGS. 3 and 2A, each end 45a of a plurality of additional wiring conductors 45 is aligned and integrated by the first resin molded body 46a, and the other end 45c of a plurality of additional wiring conductors 45 is aligned and integrated by the second resin molded body 46b. V-shaped elastic deformation portions 45b are provided in the intermediate portions of a plurality of additional wiring conductors 45 communicating the first and second resin molded bodies 46a and 46b. Protrusions 45d provided at one end 45a of a plurality of additional wiring conductors 45 are brought into press-contact with the input/output control terminals 155a of the circuit board 152 through the first resin molded body 46a and the elastic mat member 136b of the first pressing elastic mat 130b. Protrusions 45x provided at the other end 45c of a plurality of additional wiring conductors 45 or provided in pressed contact portions 148c of the additional external terminals 148 are brought into press-contact with mating surfaces through the second resin molded body 46b and the elastic mat member 135b of the first pressing elastic mat 130b.

In FIGS. 3 and 13, contact terminal portions 181a which are one end of a plurality of first wiring conductors 181 are molded integrally with or press-fitted into and held by the control signal connector 180 mounted on the cover 160, and pressed contact portions 181c which are the other end of a plurality of first wiring conductors 181 are aligned and integrated by the divided resin molded body 182a. Protrusions 181d are provided to protrude from the pressed contact portions 181c. The pressed contact portions 181c are connected to the contact terminal portions 181a through bending deformation portions 181b. The protrusions 181d of the pressed contact portions 181c are brought into press-contact with the input/output control terminals 157a provided on the front surface of the circuit board 152 through the divided resin molded body 182a and the elastic mat member 137b of the first pressing elastic mat 130b.

The control signal connector 180 is inserted from the connector window hole 164 of the cover 160 and passes through and is fixed to the cover 160 by a detachment prevention hook 187 and a waterproof sealing material 188. A plurality of first wiring conductors 181 and additional wiring terminals 183 are press-fitted into and fixed to a press-fitting body portion 186.

A plurality of additional wiring terminals 183 constituted by contact terminal portions 183a and pressed contact portions 183c are molded integrally with or press-fitted into and fixed to the control signal connector 180. The pressed contact portions 183c which are the other end of a plurality of additional wiring terminals 183 are aligned and integrated by the divided resin molded body 182b, and the pressed contact portions 183c are connected to the contact terminal portions 183a through bending deformation portions 183b.

In FIGS. 3 and 2C, input/output control terminals 157b provided on the rear surface of the circuit board 152 are connected to the pressed contact portions 183c through a plurality of additional wiring conductors 44. One end 44a of a plurality of additional wiring conductors 44 is aligned and integrated by the first resin molded body 48a, and the other end 44c of a plurality of additional wiring conductors 44 is aligned and integrated by the second resin molded body 48b. V-shaped elastic deformation portions 44b are provided in the intermediate portions of a plurality of additional wiring conductors 44 communicating the first and second resin molded bodies 48a and 48b. Protrusions 44d provided at the other end 44c of a plurality of additional wiring conductors 44 are brought into press-contact with the input/output control terminals 157b on the rear surface of the circuit board 152 through the second resin molded body 48b and an elastic mat member 137a of the second pressing elastic mat 130a. Protrusions 183x provided at one end 44a of a plurality of additional wiring conductors 44 or provided in the pressed contact portions 183c of the additional wiring terminals 183 are brought into press-contact with mating surfaces through the divided resin molded body 182b and the elastic mat member 138b of the first pressing elastic mat 130b.

Figure 6:
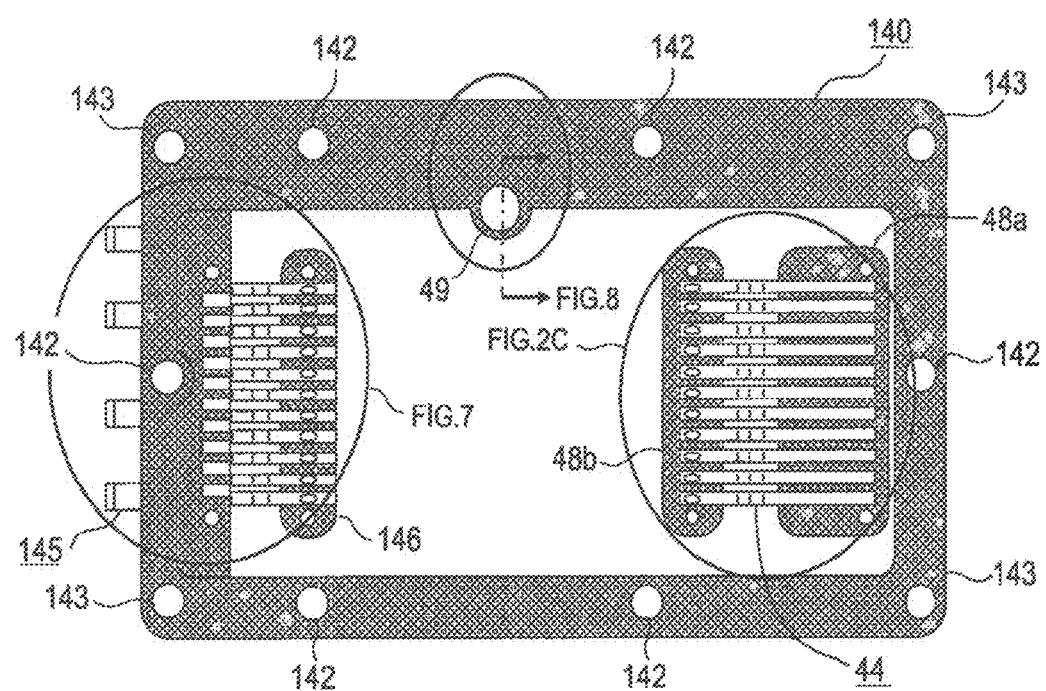
FIG. 6 is a plan view of an annular peripheral wall member in the electronic control device of FIG. 1.
Figure 7:
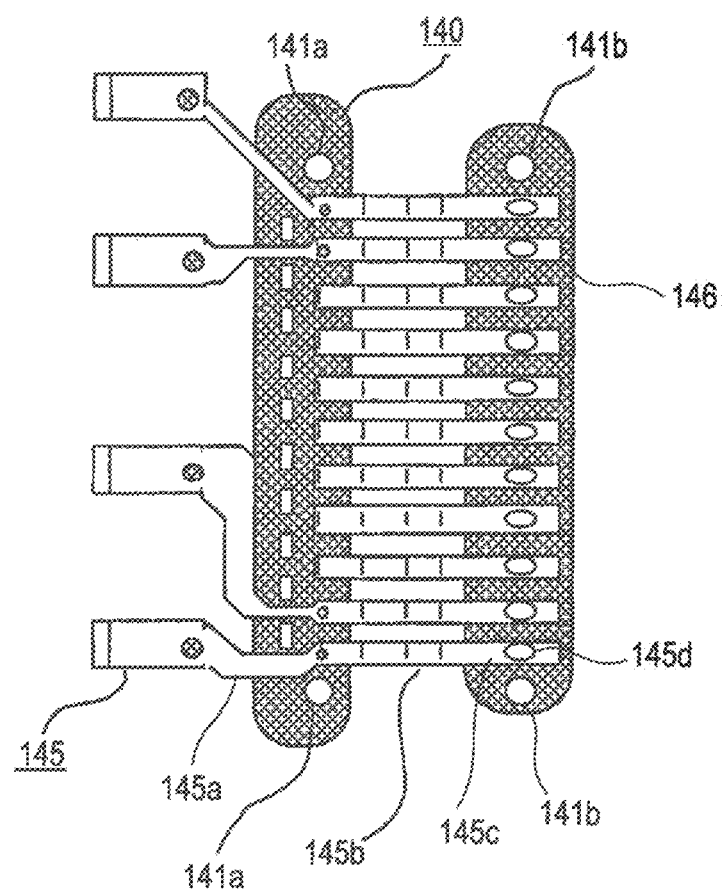
FIG. 7 is a partial detail view of a second wiring conductor in the electronic control device of FIG. 1.
Figure 8A:
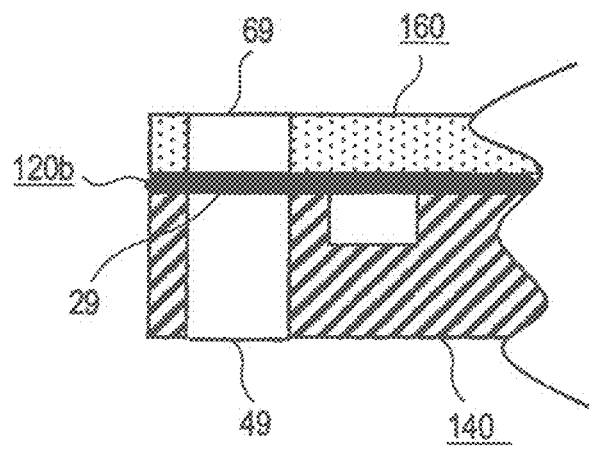
FIGS. 8A to 8D are sectional views showing a first partial modification in the electronic control device of FIG. 1.
Figure 8B:
Figure 8C:
Figure 8D:

In FIGS. 3, 6, and 7, external terminal portions 145a which are one end of a plurality of second wiring conductors 145 are molded integrally with the annular peripheral wall member 140 made of a resin molding material, are exposed outside the annular peripheral wall member, and are connected to the input/output connector 423. Pressed contact portions 145c which are the other end of a plurality of second wiring conductors 145 are integrally molded and aligned and arranged by a divided resin molded body 146. Protrusions 145d are provided to protrude from the pressed contact portions 145c. The pressed contact portions 145c are connected to external terminal portions 145a through V-shaped elastic deformation portions 145b. The protrusions 145d of the pressed contact portions 145c are brought into press-contact with the input/output control terminals 155b provided on the rear surface of the circuit board 152 through the divided resin molded body 146 and an elastic mat member 136a of the second pressing elastic mat 130a.

The positioning pins 161 fixed to the cover 160 pass through the pairs of pin through holes 141a and 141b (see FIG. 7).

In the annular peripheral wall member 140, the additional external terminals 148 constituted by external terminal portions 148a and the pressed contact portions 148c orthogonal to each other are integrally molded. The external terminal portions 148a pass through the bottom wall of the annular peripheral wall member 140, pass through a wiring window hole 125 (see FIG. 9) provided in the second interior packing 120a, a wiring window hole 115 (see FIG. 10) provided in the base 110, and a wiring window hole 415 (see FIG. 11) provided in the exterior packing 410, and are inserted into the storage container of the actuator 400.

A waterproof sealing material 148s is applied to a bottom portion of the annular peripheral wall member 140 through which the external terminal portions 148a pass (see FIG. 3).

An input sensor in the storage container is connected to the tips of the external terminal portions 148a through a connector usable in oil. The input/output control terminals 155a provided on the front surface of the circuit board 152 are connected to the pressed contact portions 148c through the above-described additional wiring conductors 45.

In FIGS. 4, 6, and 8A to 8D, the annular peripheral wall member 140 is provided with a first air pressure adjustment window 49. The cover 160 is provided with a second air pressure adjustment window 69 at a position facing the first air pressure adjustment window 49. The first interior packing 120b is provided with the air pressure adjustment film 29 which is a thin-film expansible portion 29b, a spherical movable portion 29c, or a wavelike movable portion 29d between the first air pressure adjustment window 49 and the second air pressure adjustment window 69.

With this, the air pressure of the airtight space constituted by the cover 160, the annular peripheral wall member 140, and the base 110 changes with an internal temperature, and when there is a differential pressure from an outside air pressure, the thin-film expansible portion 29b swells or the spherical movable portion 29c or the wavelike movable portion 29d moves from a high air pressure side to a low air pressure side, thereby preventing flow of atmosphere and accompanying entrance of oil-water.

Figure 9:
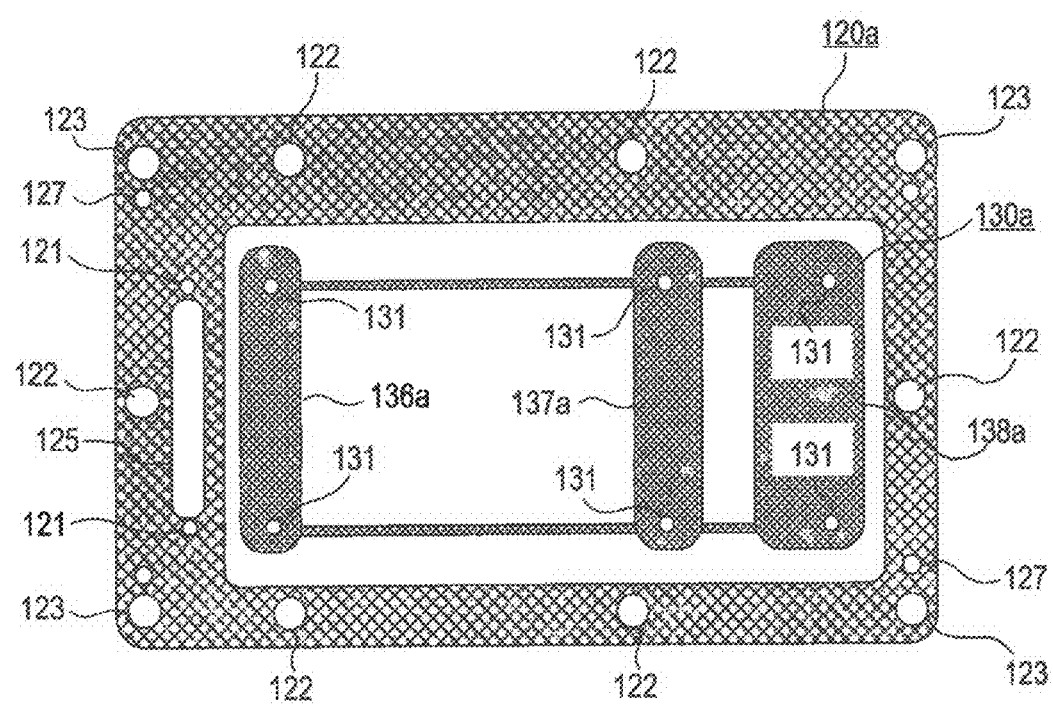
FIG. 9 is a plan view of a second interior packing and a second pressing elastic mat in the electronic control device of FIG. 1.

In FIGS. 3 and 9, the second interior packing 120a is provided with pin through holes 121 through which the positioning pins 161 pass, a plurality of bolt through holes 122 through which the first fixing members 91 pass, a plurality of bolt through holes 123 through which the second fixing members 411 pass, and the above-described wiring window hole 125.

Second fitting portions 127 are provided at the four corners of the second interior packing 120a, and fitting protrusions (not shown) provided at four corners of the bottom of the annular peripheral wall member 140 are fitted into the second fitting portions 127, thereby regulating the attachment position of the second interior packing 120a to the base 110. The height of the fitting protrusions is lower than the dimension after compression of the second interior packing 120a.

The second pressing elastic mat 130a is integrally constituted by a plurality of pin through holes 131 through which the positioning pins 161 pass, the elastic mat member 136a which presses the divided resin molded body 146 of the second wiring conductors 145, the elastic mat member 137a which presses the second resin molded body 48b of the additional wiring conductors 44, and an elastic mat member 138a which presses the first resin molded body 48a provided in the pressed contact portions of the additional wiring conductors 44.

Figure 10:
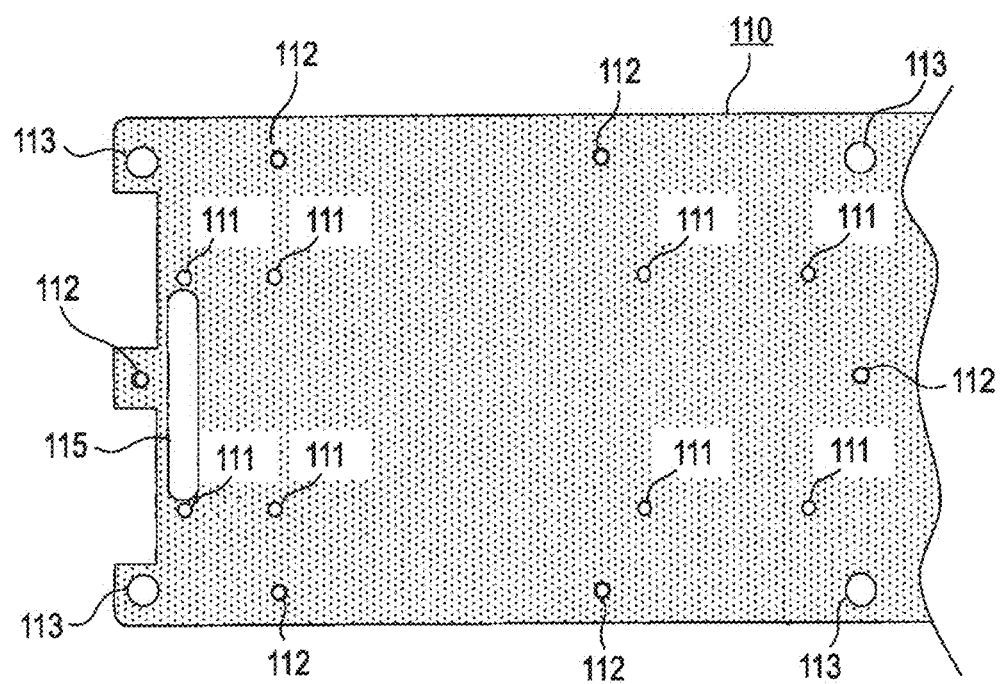
FIG. 10 is a plan view of a base in the electronic control device of FIG. 1.

In FIGS. 3 and 10, the base 110 constituting the electronic control device 100 is provided with a plurality of bag holes 111 into which the positioning pins 161 are fitted, a plurality of screw holes 112 into which the first fixing members 91 are screwed, a plurality of unloaded holes 113 through which the second fixing members 411 pass, and the above-described wiring window hole 115. The openings of the bag holes 111 have a funnel shape to facilitate the fitting of the positioning pins 161. The fitting of the positioning pins 161 and the bag holes 111 starts immediately before the first fixing members 91 start to be fastened. The depth of a small-diameter portion which is the effective depth of the bag holes 111 has a value equal to or greater than the total value of the press-compression dimension of the first and second pressing elastic mats 130b and 130a.

Figure 11:
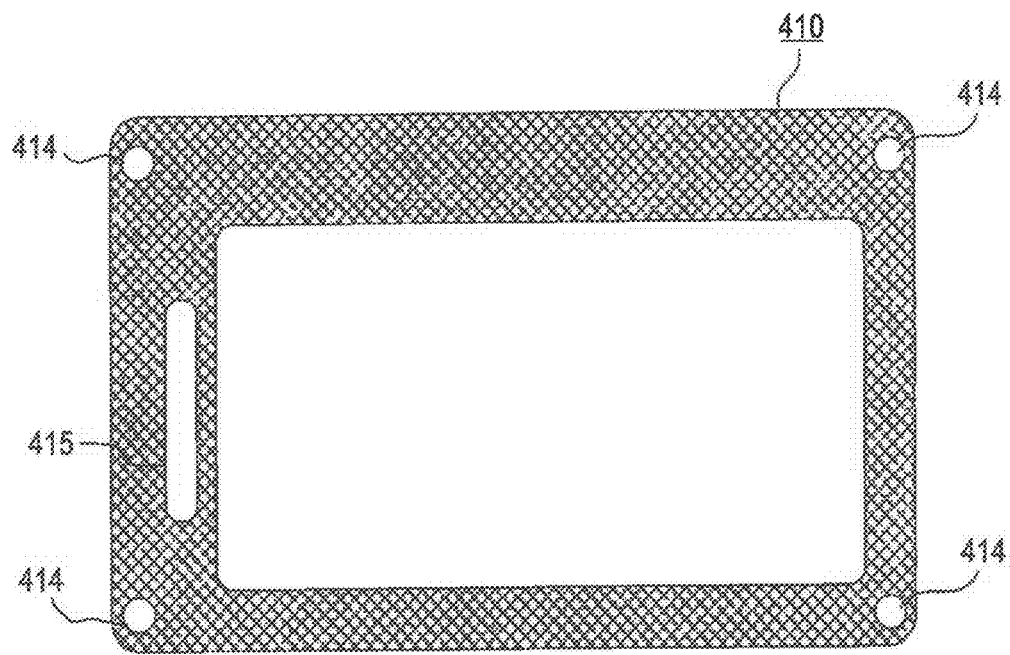
FIG. 11 is a plan view of an exterior packing which is used in combination outside the electronic control device of FIG. 1.

In FIGS. 3 and 11, the exterior packing 410 not included in the electronic control device 100 is provided with a plurality of bolt through holes 414 through which the second fixing members 411 pass, and the above-described wiring window hole 415.

In FIGS. 3 and 12, a plurality of pieces of input/output equipment 420 which are hydraulic electromagnetic valves are mounted on an input/output equipment attachment surface 401 of the actuator 400, and respectively include an electromagnetic coil 422 embedded in a magnetic yoke 421, an input/output connector 423 for supplying power to the electromagnetic coil 422, and a movable magnetic iron core 426 and a pushing spring 425 embedded in a nonmagnetic pipe 424. The magnetic iron core 426 is attracted in response to the excitation current to the electromagnetic coil 422, and hydraulic oil flowing from an oil supply input passage 402 into an oil supply input port 427 is sent from an oil supply output port 428 to an oil supply output passage 403, if the electromagnetic coil 422 is demagnetized, the oil supply output port 428 is blocked, and oil supply from the oil supply output passage 403 is stopped.

When the input/output equipment 420 is a linear solenoid, a configuration in which an output oil pressure in proportion to the magnitude of an excitation current to the electromagnetic coil 422 can be obtained is made.

In this case, a label resistor for correcting an individual variation fluctuation of an excitation current-to-output oil pressure characteristic is added, and the control unit 150 reads the resistance value of the label resistor and adjusts a control characteristic to perform correction control so as to obtain a predetermined target oil pressure.

Next, FIGS. 14A to 14E which are sectional views showing a second partial modification in the electronic control device 100 will be described.

Figure 14:
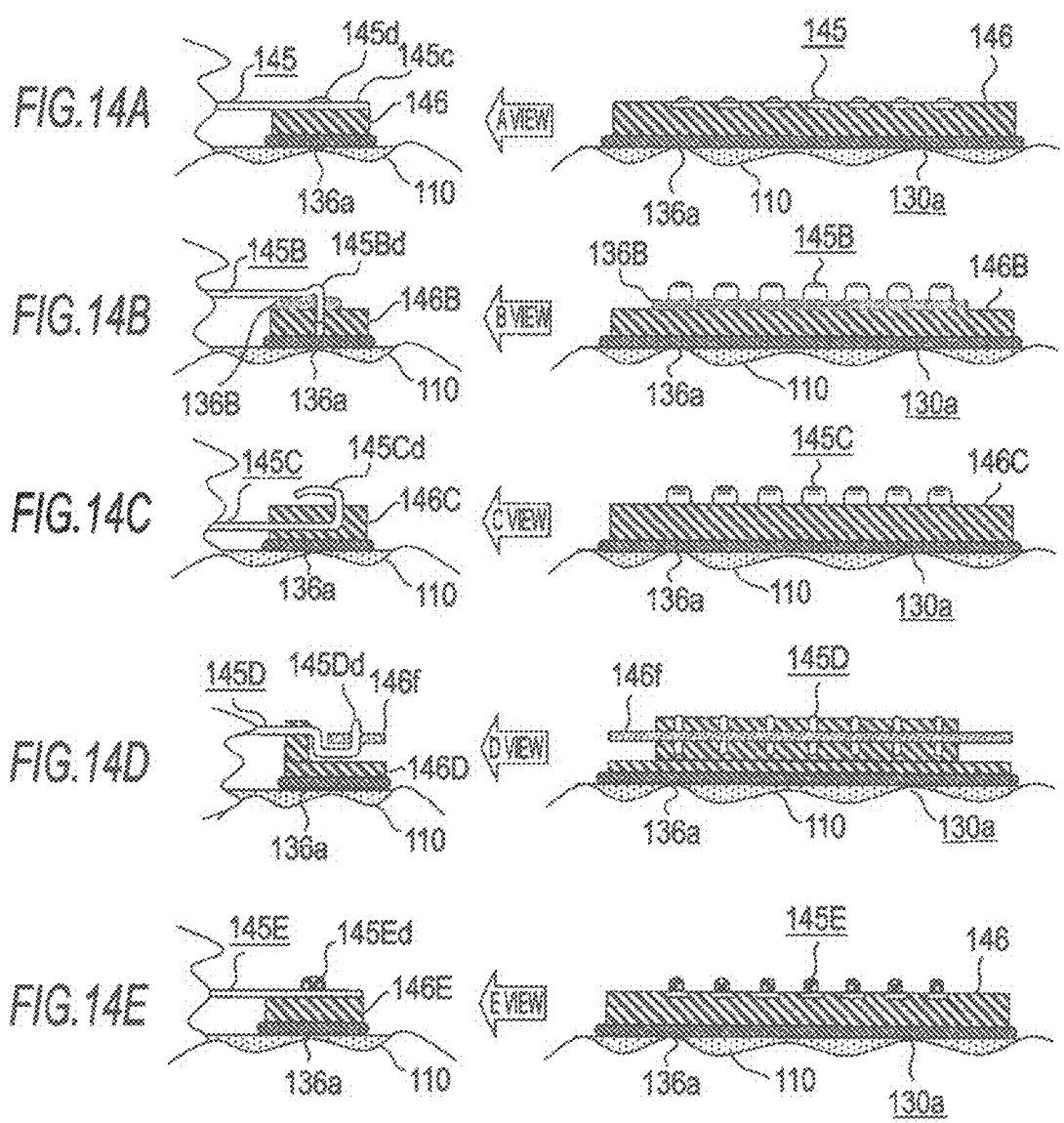
FIGS. 14A to 14E are sectional views showing a second partial modification in the electronic control device of FIG. 1.

A left view of FIG. 14A shows the relative relationship between the pressed contact portion 145c of the above-described second wiring conductor 145, the protrusion 145d, and the divided resin molded body 146, and the elastic mat member 136a (see FIGS. 3 and 9) of the second pressing elastic mat 130a and the base 110. An end view when the left view is viewed from the direction of arrow A is a right view.

A left view and a right view of FIG. 14B show a correlation when a second wiring conductor 145B which is one of modifications is viewed from the same viewpoint as FIG. 14A. A pressed contact portion 145c of the second wiring conductor 145B has a tip portion bent in an orthogonal direction, and the orthogonal bent portion is fitted into a groove hole provided in a divided resin molded body 146B to constitute a protrusion 145Bd in conductive contact with the input/output control terminal 155b on the rear surface of the circuit board 152. The elastic mat member 136a which is apart of the second pressing elastic mat 130a is interposed between the divided resin molded body 146B and the base 110, and an additional elastic mat member 136B having hardness lower than the second pressing elastic mat 130a is interposed between the second wiring conductor 145B and the divided resin molded body 146B.

A left view and a right view of FIG. 14C show a correlation when a second wiring conductor 145C which is one of modifications is viewed from the same viewpoint as FIG. 14A. A pressed contact portion 145c of the second wiring conductor 145C has a tip portion folded in a U-shaped direction, and the U-shaped folded portion becomes an elastic deformation member which protrudes outside a divided resin molded body 146C. A protrusion 145Cd in conductive contact with the input/output control terminal 155b on the rear surface of the circuit board 152 is constituted in the tip portion of the U-shaped folded portion. The elastic mat member 136a which is a part of the second pressing elastic mat 130a is interposed between the divided resin molded body 146C and the base 110.

A left view and a right view of FIG. 14D show a correlation when a second wiring conductor 145D which is one of modifications is viewed from the same viewpoint as FIG. 14A. A pressed contact portion 145c of the second wiring conductor 145D is provided with a concave bent portion double bent in a concave shape, and the concave bent portion becomes an elastic deformation member which protrudes outside a divided resin molded body 146D. A protrusion 145Dd in conductive contact with the input/output control terminal 155b on the rear surface of the circuit board 152 is constituted in the tip portion of the concave bent portion. The tip portion is aligned with a connection member 146f made of a resin material molded simultaneously with the divided resin molded body 146D fitted into the concave bent portion. The elastic mat member 136a which is a part of the second pressing elastic mat 130a is interposed between the divided resin molded body 146D and the base 110.

A left view and a right view of FIG. 14E show a correlation when a second wiring conductor 145E which is one of modifications is viewed from the same viewpoint as FIG. 14A. A conductive gel material to be a protrusion 145Ed in conductive contact with the input/output control terminal 155b on the rear surface of the circuit board 152 is applied to a pressed contact portion 145c of the second wiring conductor 145E. The elastic mat member 136a which is a part of the second pressing elastic mat 130a is interposed between a divided resin molded body 146E and the base 110.

According to the second wiring conductor 145 shown in FIG. 14A, if slight unevenness occurs in the input/output control terminal surface on the circuit board side and the alignment plane of the protrusion on the second wiring conductor side, contact failure may occur due to unevenness of a pressing force among a plurality of protrusions. Meanwhile, for example, when a multiplayer glass epoxy substrate is used as the circuit board 152, the circuit board 152 is compressively deformed individually in the pressing contact surface of the circuit board 152 and the protrusion on the wiring conductor side to absorb a dimension error, whereby it is possible to prevent the occurrence of contact failure due to unevenness of a pressing force among a plurality of protrusions.

In contrast, according to the second wiring conductors of the modifications shown in FIGS. 14B to 14E, if slight unevenness occurs in the input/output control terminal surface on the circuit board side and the alignment plane of the protrusion on the second wiring conductor side, the compression dimension of the additional elastic mat member 136B or the compression dimension of the elastic deformation member or the conductive gel material fluctuates to absorb a dimension error, thereby preventing the occurrence of contact failure due to unevenness of a pressing force among a plurality of protrusions.

Therefore, strict processing management for suppressing a dimension error is not required.

(2) Detailed Description of Action and Operation

Input/output signals which are handled by the electronic control device 100 according to Embodiment 1 will be described comprehensively. The control signal connector 180 having the first wiring conductors 181 and the additional wiring terminals 183 is connected to, for example, an engine control device to be a host controller (not shown), and the control unit 150 receives control power and a control command signal and performs a control operation to report and return the control state to the engine control device.

For example, although a gear shift sensor which detects the selection position of a gear shift lever is provided near the electronic control device 100 to be a transmission control device, in this embodiment, these input signals which are commonly used in the engine control device and the transmission control device outside the actuator 400 to be an automatic transmission are input to the engine control device once and is transmitted from the engine control device to the transmission control device through the control signal connector 180.

In regards to the input/output control terminals 155 and 157 of the circuit board 152 in this application, the copper foil patterns are used as they are without using wire-bonded relay terminals. For this reason, double-sided terminals are easily obtained, and it is possible to secure a required number of terminals even when the terminal width is widened and to improve contact reliability.

While a plurality of pieces of input/output equipment 420 which are linear solenoid valves or on/off control valves are connected to a plurality of second wiring conductors 145 provided in the annular peripheral wall member 140, in addition to a power supply terminal to the electromagnetic coil 422, for example, a signal terminal to which a label resistor to be parameter data for correction control of an individual variation fluctuation of a control characteristic is connected is provided to the input/output connector 423.

In addition, input sensors, such as a hydraulic sensor, a temperature sensor, and a rotation sensor provided inside an automatic transmission, are connected to the control unit 150 through the additional external terminals 148, and double-sided terminals of the circuit board 152 are effectively used.

A part of the input signals passes through a microprocessor in the control unit 150 and is transmitted to the engine control device through the control signal connector 180.

In this embodiment, although the second wiring conductors 145 are connected to the input/output control terminals 155b on the rear surface of the circuit board 152, and the additional external terminals 148 protruding from the bottom wall of the annular peripheral wall member 140 are connected to the input/output control terminals 155a on the front surface, reversely, the second wiring conductors 145 protruding from the circumferential wall of the annular peripheral wall member 140 may be connected to the input/output control terminals 155a on the front surface of the circuit board 152 through the additional wiring conductors 44, and the additional external terminals 148 may be connected to the input/output control terminals 155b on the rear surface of the circuit board 152.

The assembly procedure of the electronic control device 100 configured as above will be described. First, the first interior packing 120b, the first pressing elastic mat 130b, the control signal connector 180, and the first elastic holding mat 39b are mounted on the inner surface of the cover 160 in a state where the inner surface of the cover 160 turns toward the ceiling. The additional wiring conductors 45, the control unit 150, the additional wiring conductors 44, the annular peripheral wall member 140, the second elastic holding mat 39a, the second pressing elastic mat 130a, the second interior packing 120a, and the base 110 are sequentially laminated and assembled in this order while being guided by the positioning pins 161. Preferably, an assembly tool is inversed vertically after the waterproof sealing material 148s is applied to the additional external terminals 148. The cover 160 and the base 110 are fastened and fixed by the blockade screws 91 as the first fixing members. Thus, the assembly of the electronic control device 100 is completed.

However, the first interior packing 120b performs mutual positioning by the first fitting portion 126 provided at the four corners thereof and the fitting protrusions (not shown)

provided at the four corners of the cover 160, and the second interior packing 120a performs mutual positioning by the second fitting portions 127 provided at the four corners thereof and the fitting protrusions (not shown) provided at the four corners of the annular peripheral wall member 140.

Therefore, the relative position of the conductive contact surface is regulated by the positioning pins, an assembly dimension error does not occur, and assembly work is performed in a simple assembly line unaccompanied by welding work.

When attaching the electronic control device 100 to the actuator 400, the entire electronic control device 100 is co-fastened and fixed by the second fixing screws 411 through the exterior packing 410.

Therefore, in this embodiment, since it is not possible to open only the cover 160 separately, it is necessary to detach the entire electronic control device 100 from the actuator 400 in order to detach the control unit 150.

During disassembly work, the pressing force of the conductive contact surface is automatically released only by opening the cover 160, and during reassembly, since it should suffice that the respective components are laminated and arranged while being guided by the positioning pins 161, an assembly dimension error does not occur.

In a practical operation, since the elastic deformation portion and the bending deformation portion are provided in each wiring conductor, sliding wear of the conductive contact surface due to expansion and contraction caused by fluctuation in temperature does not occur.

(3) Main Points and Features of Embodiment 1

As will be apparent from the above description, the electronic control device 100 according to Embodiment 1 of the invention includes the control unit 150 which has a plurality of input/output control terminals 155 and 157 provided on the circuit board 152 with the electronic components 153 mounted thereon. In the electronic control device 100, the control unit 150 communicates a control signal with the host controller through the input/output control terminals 157 and the control signal connector 180, and controls the actuator 400 to be control-target equipment through the input/output control terminals 155 and the input/output connector 423. The second wiring conductors 145 in contact with the input/output control terminals 155 to connect the input/output control terminals and the input/output connector 423, the first wiring conductors 181 in contact with the input/output control terminals 157 to connect the input/output control terminals and the control signal connector 180, and the control unit 150 are stored in a region surrounded by the annular peripheral wall member 140, the base 110 covering one side of the annular peripheral wall member, and the cover 160 covering the other side of the annular peripheral wall member. The first interior packings 120b to 120d are interposed between the cover 160 and the annular peripheral wall member 140. The second interior packing 120a is interposed between the base 110 and the annular peripheral wall member 140. The first pressing elastic mat 130b which presses the contact portions between the input/output control terminals 157 and the first wiring conductors 181 from the inner surface of the cover 160, and the second pressing elastic mat 130a which presses the contact portions between the input/output control terminals 155 and the second wiring conductors 145 from the inner surface of the base 110 are arranged.

The cover 160, the base 110, and the annular peripheral wall member 140 are fastened and fixed to one another by at least the first fixing members 91. The cover 160 and the base 110 are fastened to each other by the first fixing members 91. In this way, the cover 160, the first interior packings 120b to 120d, the annular peripheral wall member 140, the second interior packing 120a, and the base 110 are fastened in a sealed state. The input/output control terminals 155 and the second wiring conductors 145 are brought into elastic contact with each other by the second pressing elastic mat 130a. The input/output control terminals 157 and the first wiring conductors 181 are brought into elastic contact with each other by the first pressing elastic mat 130b. The first interior packings 120b to 120d and the second interior packing 120a are non-adhesive elastic packings. If the cover 160 is opened, the input/output control terminals 155 and 157, the second wiring conductors 145, and the first wiring conductors 181 are separated from one another, such that the control unit 150 can be detached. The relative positions of the input/output control terminals 155 and 157, the second wiring conductors 145, and the first wiring conductors 181 are regulated by the positioning pins 161 protruding from the cover 160.

While the annular peripheral wall member 140 is made of a resin molding material, the cover 160 and the base 110 are made of a metal material subjected to molding or sheet metal working. The first fixing members 91 elastically hold the exterior body 151 constituting the control unit 150 between the cover 160 and the base 110 through the thermally conductive first elastic holding mat 39b in contact with the inner surface of the cover 160 and the thermally conductive second elastic holding mat 39a in contact with the inner surface of the base 110. The hardness of the first elastic holding mat 39b and the second elastic holding mat 39a is soft compared to the hardness of the first pressing elastic mat 130b and the second pressing elastic mat 130a.

As above, in relation to a second aspect of the invention, the control unit is elastically held between the cover and the base made of a metal material through the thermally conductive first and second elastic holding mats, and the first and second elastic holding mats have hardness softer than the first and second pressing elastic mats.

Therefore, it is possible to suppress an increase in temperature by transmitting heat generated from the control unit as a compact and highly integrated electronic circuit module to the cover and the base made of a metal material, and to balance the elastic holding force by the first and second elastic holding mats on the front and rear surfaces of the control unit, and to suppress fluctuation in the pressing force of the conductive contact surface by the first and second pressing elastic mats.

The same applies to Embodiment 2 and Embodiment 3 described below.

The circuit board 152 with the electronic components 153 mounted thereon is sealed airtight by sealing resin to be the exterior body 151. The left side or the right side of the circuit board 152 is exposed from the exterior body 151, and a plurality of copper foil patterns to be the input/output control terminals 155 and 157 are generated on at least one of the front surface and the rear surface of the exposed substrate surface. The external terminal portions 145a which are one end of a plurality of second wiring conductors 145 are molded integrally with the annular peripheral wall member 140 made of a resin molding material, are exposed outside the annular peripheral wall member, and are connected to the input/output connector 423. The pressed contact portions 145c which are the other end of a plurality of second wiring conductors 145 are integrally molded by the divided resin molded body 146 and aligned and arranged. The pressed contact portions 145c are provided with the protrusions 145d. The pressed contact portions 145c are connected to the external terminal portions 145a through the elastic deformation portions 145b. The protrusions 145d of the pressed contact portions 145c are brought into press-contact with the input/output control terminals 155b provided on the rear surface of the circuit board 152 through the divided resin molded body 146 and the second pressing elastic mat 130a.

As above, in relation to a third aspect of the invention, the second wiring conductors are constituted by the external terminal portions, the elastic deformation portions, and the pressed contact portion having the protrusions, the external terminal portions are molded integrally with the annular peripheral wall member, and the pressed contact portions are integrally molded by the divided resin molded body and are in contact with the rear surface of the circuit board.

Therefore, since the conductive contact surface to the circuit board is only one surface, and a plurality of conductive contact surfaces are not provided, it is possible to prevent degradation of contact reliability.

Since the second wiring conductors are integrated with the annular peripheral wall member in advance, assembly work is facilitated, and thermal expansion and contraction of the wiring conductors are absorbed by the elastic deformation portions, whereby it is possible to prevent the occurrence of sliding wear of the pressing contact portions.

In the annular peripheral wall member 140, the additional external terminals 148 constituted by the external terminal portions 148a and the pressed contact portions 148c orthogonal to each other are integrally molded. The external terminal portions 148a pass through the bottom wall of the annular peripheral wall member 140, pass through the wiring window hole 125 provided in the second interior packing 120a, the wiring window hole 115 provided in the base 110, and the wiring window hole 415 of the exterior packing 410 arranged on the outer surface of the base 110, and are inserted into the storage container of the actuator 400. An input sensor in the storage container is connected to the tips of the external terminal portions 148a through a connector usable in oil. The input/output control terminals 155a provided on the front surface of the circuit board 152 are connected to the pressed contact portions 148c of the additional external terminals 148 through a plurality of additional wiring conductors 45. One end 45a of a plurality of additional wiring conductors 45 is aligned and integrated by the first resin molded body 46a, and the other end 45c of a plurality of additional wiring conductors 45 is aligned and integrated by the second resin molded body 46b. The elastic deformation portions 45b are provided in the intermediate portions of a plurality of additional wiring conductors 45 communicating the first and second resin molded bodies 46a and 46b. The protrusions 45d provided at one end 45a of a plurality of additional wiring conductors 45 are brought into press-contact with the input/output control terminals 155a on the front surface of the circuit board 152 through the first resin molded body 46a and the first pressing elastic mat 130b. The protrusions 45x provided at the other end 45c of a plurality of additional wiring conductors 45 or provided in the pressed contact portions 148c of the additional external terminals 148 are brought into press-contact with the mating surfaces through the second resin molded body 46b and the first pressing elastic mat 130b.

As above, in relation to a fourth aspect of the invention, one end and the other end of a plurality of additional wiring conductors connected to the input sensor in the actuator are aligned and integrated by the first and second resin molded bodies, the first and second exposed surfaces from the molded bodies are brought into press-contact with the input/output control terminals on the front surface of the circuit board and the additional external terminals, and the elastic deformation portions are provided in the intermediate portions of a plurality of wiring conductors communicating the first and second resin molded bodies.

Therefore, while the additional wiring conductors contact on two surfaces of the conductive contact surface to the circuit board and the conductive contact surface to the external terminal portions, in case of a safety circuit which requires advanced contact reliability, it is possible to connect a plurality of load wiring conductors in parallel or to widen the terminal width to widen a contact area, and to obtain many input/output control terminals with space saving by effectively using the input/output control terminals provided on both surfaces of the circuit board.

Since a plurality of additional wiring conductors are aligned and integrated by the first and second resin molded bodies in advance, assembly work is facilitated, and thermal expansion and contraction of the wiring conductors are absorbed by the elastic deformation portions, whereby it is possible to prevent the occurrence of sliding wear of the pressing contact portions.

The circuit board 152 with the electronic components 153 mounted thereon is sealed airtight by sealing resin to be the exterior body 151. The left side or the right side of the circuit board 152 is exposed from the exterior body 151, and a plurality of copper foil patterns to be the input/output control terminals 155 and 157 are generated on at least one of the front surface and the rear surface of the exposed substrate surface. The contact terminal portions 181a which are one end of a plurality of first wiring conductors 181 are molded integrally with or press-fitted into and held by the control signal connector 180 mounted on the cover 160. The pressed contact portions 181c which are the other end of a plurality of first wiring conductors 181 are aligned and integrated by the divided resin molded body 182a. The pressed contact portions 181c are provided with the protrusions 181d. The pressed contact portions 181c are connected to the contact terminal portions 181a through the bending deformation portions 181b. The protrusions 181d of the pressed contact portions 181c are brought into press-contact with the input/output control terminals 157a provided on the front surface of the circuit board 152 through the divided resin molded body 182a and the first pressing elastic mat 130b.

As above, in relating to a seventh aspect of the invention, the first wiring conductors are constituted by the external terminal portions, the bending deformation portions, and the pressed contact portions having the protrusions, the external terminal portions are integrated with the control signal connector mounted on the cover, and the pressed contact portions are aligned and integrated by the divided resin molded body and are in contact with the front surface of the circuit board.

Therefore, since the conductive contact surface to the circuit board is only one surface, and a plurality of conductive contact surfaces are not provided, it is possible to prevent degradation of contact reliability.

Since the first wiring conductors are integrated with the control signal connector in advance, assembly work is facilitated, and the influence of thermal expansion and contraction of the wiring conductors is avoided by the bending deformation portions, whereby it is possible to prevent the occurrence of sliding wear of the pressing contact portions.

A plurality of additional wiring terminals 183 constituted by the contact terminal portions 183a and the pressed contact portions 183c are molded integrally with or press-fitted into and fixed to the control signal connector 180. The pressed contact portions 183c which are the other end of a plurality of additional wiring terminals 183 are aligned and integrated by the divided resin molded body 182b. The pressed contact portions 183c are connected to the contact terminal portions 183a through the bending deformation portions 183b. The input/output control terminals 157b provided on the rear surface of the circuit board 152 are connected to the pressed contact portions 183c of the additional wiring terminals 183 through a plurality of additional wiring conductors 44. One end 44a of a plurality of additional wiring conductors 44 is aligned and integrated by the first resin molded body 48a, and the other end 44c of a plurality of additional wiring conductors 44 is aligned and integrated by the second resin molded body 48b. The elastic deformation portions 44b are provided in the intermediate portions of a plurality of additional wiring conductors 44 communicating the first and second resin molded bodies 48a and 48b. The protrusions 44d provided at the other end 44c of a plurality of additional wiring conductors 44 are brought into press-contact with the input/output control terminal 157b on the rear surface of the circuit board 152 through the second resin molded body 48b and the second pressing elastic mat 130a. The protrusions 183x provided at one end 44a of a plurality of additional wiring conductors 44 or provided in the pressed contact portions 183c of the additional wiring terminals 183 are brought into press-contact with the mating surfaces through the divided resin molded body 182b and the first pressing elastic mat 130b.

As above, in relation to an eighth aspect of the invention, the control signal connector is connected to the input/output control terminals provided on the rear surface of the circuit board through the additional wiring conductors having the bending deformation portions.

Therefore, while the additional wiring conductors contact on two surfaces of the conductive contact surface to the circuit board and the conductive contact surface to the additional wiring terminal, in case of a safety circuit which requires advanced contact reliability, it is possible to connect a plurality of load wiring conductors in parallel or to widen the terminal width to widen a contact area, and to obtain many input/output control terminals with space saving by effectively using the input/output control terminals provided on both surfaces of the circuit board.

Since a plurality of additional wiring conductors are aligned and integrated by the first and second resin molded bodies in advance, assembly work is facilitated, and the influence of thermal expansion and contraction of the wiring conductors is avoided by the elastic deformation portions and the bending deformation portions, whereby it is possible to prevent the occurrence of sliding wear of the pressing contact portions.

The relative positions of the input/output control terminals 155 and 157, the second wiring conductors 145, and the first wiring conductors 181, or the additional wiring conductors 44 and 45, the additional external terminals 148, and the additional wiring terminals 183 are regulated by the positioning pins 161 protruding from the cover 160. The base 110 is provided with the bag holes 111 into which the positioning pins 161 are fitted. The openings of the bag holes 111 have a funnel shape. The effective fitting depth of the positioning pins 161 has dimension equal to or greater than the total press-compression dimension of the first pressing elastic mat 130b and the second pressing elastic mat 130a.

As above, in relation to an eleventh aspect of the invention, the relative positions of the input/output control terminals of the circuit board, the second wiring conductors, and the first wiring conductor, or the additional wiring conductors, the additional external terminals, and the additional wiring terminals are regulated by the positioning pins protruding from the cover fitted into the bag holes provided in the base.

Therefore, the first interior packing 120b, the first pressing elastic mat 130b, the control signal connector 180, and the first elastic holding mat 39b are mounted on the inner surface of the cover 160 in a state where the inner surface of the cover 160 turns toward the ceiling. The additional wiring conductors 45, the control unit 150, the additional wiring conductors 44, the annular peripheral wall member 140, the second elastic holding mat 39a, the second pressing elastic mat 130a, the second interior packing 120a, and the base 110 are sequentially laminated and assembled in this order while being guided by the positioning pins 161. Preferably, the assembly tool is inversed vertically after the waterproof sealing material 148s is applied to the additional external terminals 148, and the cover 160 and the base 110 are fastened and fixed by the blockade screws 91 as the first fixing members. Thus, the assembly of the electronic control device 100 is completed.

For this reason, the relative position of the conductive contact surface is regulated by the positioning pins, an assembly dimension error does not occur, and assembly work is performed in a simple assembly line unaccompanied by welding work.

The thickness and hardness of the first pressing elastic mat 130b and the second pressing elastic mat 130a are greater and softer than the first interior packing 120b and the second interior packing 120a. When the blockade screws as the first fixing members 91 are fastened with predetermined torque, the compressive deformation amount of the first interior packing 120b and the second interior packing 120a is small and the compressive deformation amount of the first pressing elastic mat 130b and the second pressing elastic mat 130a is large. The contact pressure of the conductive contact surface is regulated by the compressive deformation amount.

As above, in relation to a thirteenth aspect of the invention, when the cover and the base are fastened and fixed by the first fixing members, the compressive deformation amount of the first and second interior packings is small, and the compressive deformation amount of the first and second pressing elastic mats is large.

Therefore, the press-compression dimension after the first and second pressing elastic mats start to press the contact surfaces increases, whereby it is possible to suppress a fluctuation error of a pressing force due to a dimension error of each portion.

The same applies to Embodiment 2.

The annular peripheral wall member 140 is provided with the first air pressure adjustment window 49. The cover 160 is provided with the second air pressure adjustment window 69 at a position facing the first air pressure adjustment window 49. The first interior packings 120b to 120d are provided with the air pressure adjustment film 29 which is the thin-film expansible portion 29b, the spherical movable portion 29c, or the wavelike movable portion 29d between the first air pressure adjustment window 49 and the second air pressure adjustment window 69.

As above, in relation to a fifteenth aspect of the invention, the air pressure adjustment windows are provided in the cover and the annular peripheral wall member, and the air pressure adjustment film is provided in the interior packing or the packing and elastic mat provided between the cover and the annular peripheral wall member.

Therefore, when the air pressure of the airtight space constituted by the cover, the annular peripheral wall member, and the base changes with internal temperature and there is a differential pressure from an outside air pressure, the thin-film expansible portion swells or the spherical movable portion or the wavelike movable portion moves from a high air pressure side to a low air pressure side, thereby preventing flow of atmosphere and accompanying entrance of oil-water.

The same applies to Embodiment 2 and Embodiment 3.

The pressed contact portion 145c of the second wiring conductor 145B has a tip portion bent in an orthogonal direction, and the orthogonal bent portion is fitted into the groove hole provided in the divided resin molded body 146B to constitute the protrusion 145Bd in conductive contact with the input/output control terminal 155b on the rear surface of the circuit board 152. The elastic mat member 136a which is a part of the second pressing elastic mat 130a is interposed between the divided resin molded body 146B and the base 110. The additional elastic mat member 136B having hardness lower than the second pressing elastic mat 130a is interposed between the second wiring conductor 145B and the divided resin molded body 146B.

As above, in relation to a sixteenth aspect of the invention, the additional elastic mat member having low hardness is interposed between the second wiring conductors and the divided resin molded body.

Therefore, if slight unevenness occurs in the input/output control terminal surface on the circuit board side and the alignment plane of the protrusion on the second wiring conductor side, the compression dimension of the additional elastic mat individually fluctuates to absorb a dimension error, whereby it is possible to prevent the occurrence of contact failure due to unevenness of a pressing force among a plurality of protrusions.

The same applies to Embodiment 2 and Embodiment 3.

The pressed contact portion 145c of the second wiring conductor 145C has a tip portion folded in a U-shaped direction, and the U-shaped folded portion becomes the elastic deformation member protruding outside the divided resin molded body 146C to constitute the protrusion 145Cd in conductive contact with the input/output control terminal 155b on the rear surface of the circuit board 152 in the tip portion of the U-shaped folded portion. The elastic mat member 136a which is apart of the second pressing elastic mat 130a is interposed between the divided resin molded body 146C and the base 110.

As above, in relation to a seventeenth aspect of the invention, the U-shaped folded portions to be the elastic deformation members are provided in the tip portions of the second wiring conductors.

Therefore, if slight unevenness occurs in the input/output control terminal surface on the circuit board side and the alignment plane of the protrusion on the second wiring conductor side, the compression dimension of the elastic deformation portions individually fluctuates to absorb a dimension error, whereby it is possible to prevent the occurrence of contact failure due to unevenness of a pressing force among a plurality of protrusions.

The same applies to Embodiment 2 and Embodiment 3.

The pressed contact portion 145c of the second wiring conductor 145D is provided with a concave bent portion double bent in a concave shape, and the concave bent portion becomes the elastic deformation member protruding outside the divided resin molded body 146D to constitute the protrusion 145Dd in conductive contact with the input/output control terminal 155b on the rear surface of the circuit board 152 in the tip portion of the concave bent portion. The tip portion is aligned with the connection member 146f made of a resin material molded simultaneously with the divided resin molded body 146D fitted into the concave bent portion. The elastic mat member 136a which is a part of the second pressing elastic mat 130a is interposed between the divided resin molded body 146D and the base 110.

As above, in relation to an eighteenth aspect of the invention, the concave bent portions to be the elastic deformation members are provided in the tip portions of the second wiring conductors.

Therefore, if slight unevenness occurs in the input/output control terminal surface on the circuit board side and the alignment plane of the protrusion on the second wiring conductor side, the compression dimension of the elastic deformation portions individually fluctuates to absorb a dimension error, whereby it is possible to prevent the occurrence of contact failure due to unevenness of a pressing force among a plurality of protrusions.

The same applies to Embodiment 2 and Embodiment 3.

The conductive gel material to be the protrusion 145Ed in conductive contact with the input/output control terminal 155b on the rear surface of the circuit board 152 is applied to the pressed contact portion 145c of the second wiring conductor 145E. The elastic mat member 136a which is a part of the second pressing elastic mat 130a is interposed between the divided resin molded body 146E and the base 110.

As above, in relation to a nineteenth aspect of the invention, the conductive gel material is applied to the tip portions of the second wiring conductors.

Therefore, if slight unevenness occurs in the input/output control terminal surface on the circuit board side and the alignment plane of the protrusion on the second wiring conductor side, the compression dimension of the conductive gel material individually fluctuates to absorb a dimension error, whereby it is possible to prevent the occurrence of contact failure due to unevenness of a pressing force among a plurality of protrusions.

The same applies to Embodiment 2 and Embodiment 3.

Embodiment 2

(1) Detailed Description of Configuration

Hereinafter, an electronic control device 200 according to Embodiment 2 of the invention will be described in detail focusing on the difference from the electronic control device shown in FIG. 1.

In the respective drawings, the same reference numerals represent the same or similar portions, reference numerals 100s relate to Embodiment 1, reference numerals 200s relate to Embodiment 2, and two-digit reference numerals are reference numerals common to the respective embodiments.

Figure 15:
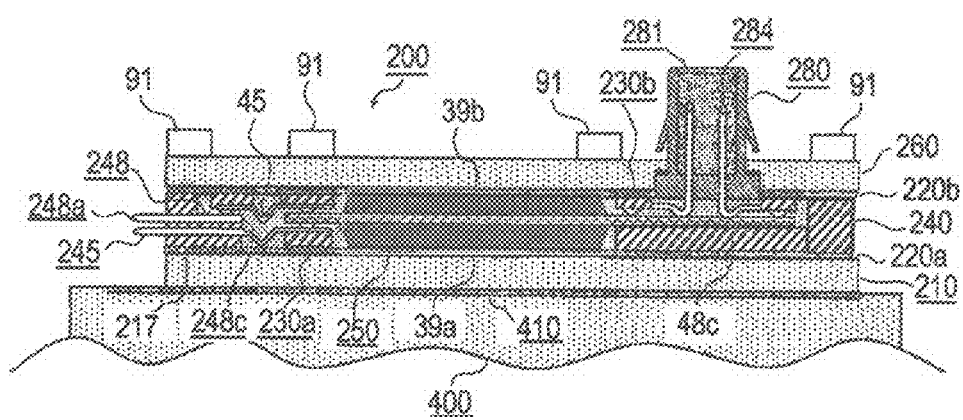
FIG. 15 is an overall configuration diagram of an electronic control device according to Embodiment 2 of the invention.
Figure 17:
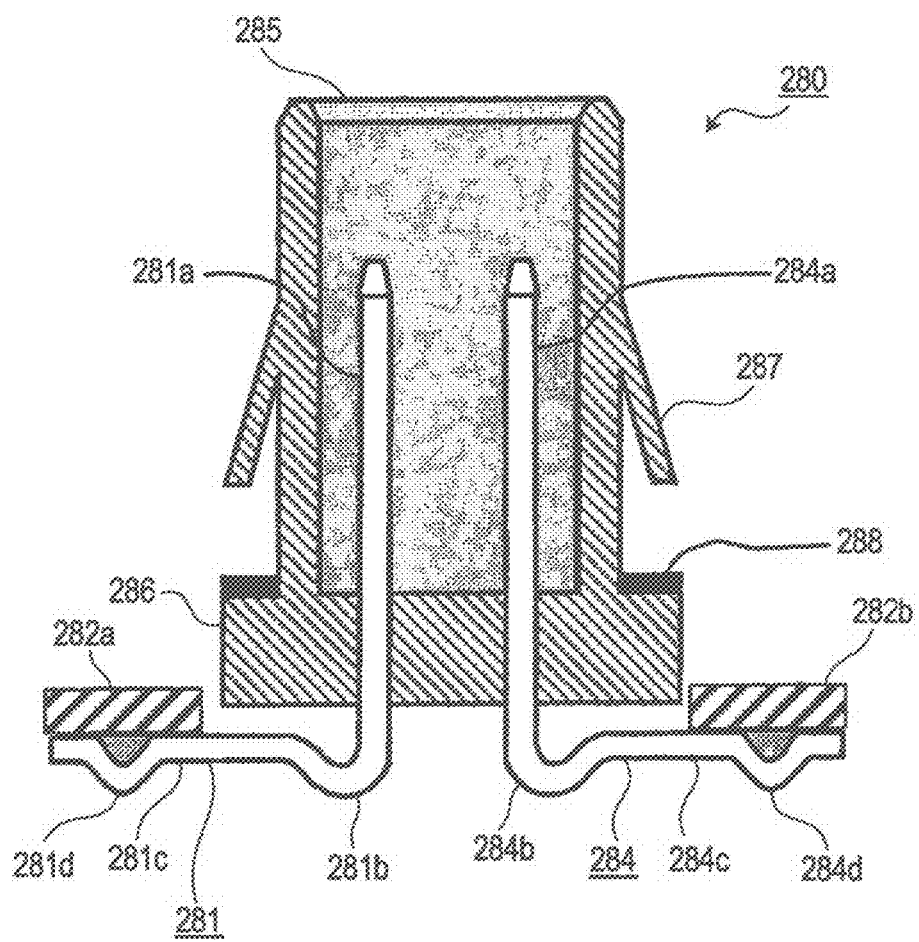
FIG. 17 is a sectional view of a control signal connector in the electronic control device of FIG. 15.

First, in FIG. 15 which is an overall configuration diagram of the electronic control device 200, similarly to the electronic control device 100, the electronic control device 200 primarily has, for example, an airtight housing constituted by a base 210 made of an aluminum die cast, an annular peripheral wall member 240 made of a resin molding material, and a cover 260 made of an aluminum die cast, and a control unit 250 stored in the airtight housing. A control signal connector 280 described below referring to FIG. 17 is fixed to the cover 260.

A first interior packing 220b is interposed between the cover 260 and the annular peripheral wall member 240, a second interior packing 220a is interposed between the base 210 and the annular peripheral wall member 240, and the first interior packing 220b and the second interior packing 220a are co-fastened and integrated by a plurality of blockade screws as first fixing members 91.

The embedded control unit 250 is elastically held between the cover 260 and the base 210 through thermally conductive first and second elastic holding mats 39b and 39a.

In the annular peripheral wall member 240, a plurality of second wiring conductors 245 and additional external terminals 248 are integrally molded.

The additional external terminals 248 are constituted by external terminal portions 248a which pass through the inside and outside of the annular peripheral wall member 240, and pressed contact portions 248c corresponding to the inside portions.

Figure 16:
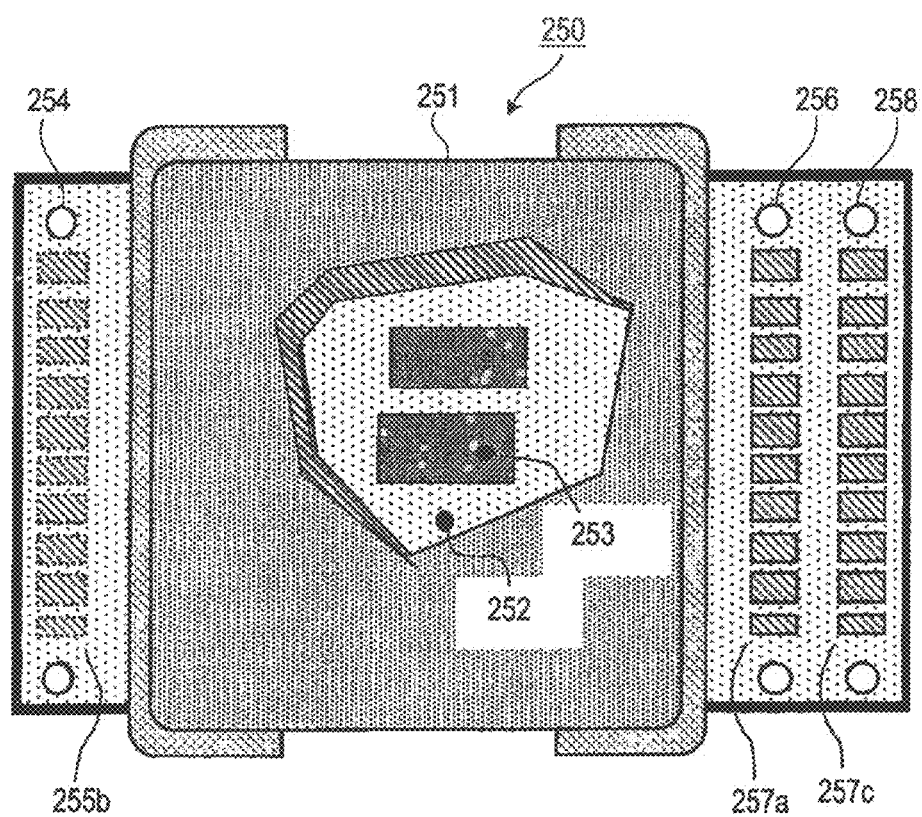
FIG. 16 is a plan view of a control unit in the electronic control device of FIG. 15.

Next, in FIG. 16 which is a plan view of the control unit 250 in the electronic control device 200, the control unit 250 includes a circuit board 252 which is integrally molded by an exterior body 251 made of a resin molding material. Various electronic components 253 primarily including a microprocessor are mounted on the circuit board 252.

The left side and the right side of the circuit board 252 are exposed from the exterior body 251, and input/output control terminals 255 and 257 which are copper foil patterns are generated in the exposed portions.

The input/output control terminals 255 (see FIG. 18) collectively refer to input/output control terminals 255a on the left front surface and input/output control terminals 255b on the left rear surface, and the input/output control terminals 257 (see FIG. 18) collectively refer to input/output control terminals 257a and input/output control terminals 257c on the right front surface. No input/output control terminals are provided on the right rear surface.

The input/output control terminals 257c are connected to circuit patterns on the rear surface by through hole plating, and are provided by moving the input/output control terminals 257b on the rear surface to the front surface.

A pair of positioning holes 254 and two pairs of positioning holes 256 and 258 are provided at both ends of a plurality of input/output control terminals 255 and 257 arranged in one row or two rows on the right and left sides.

Figure 19:
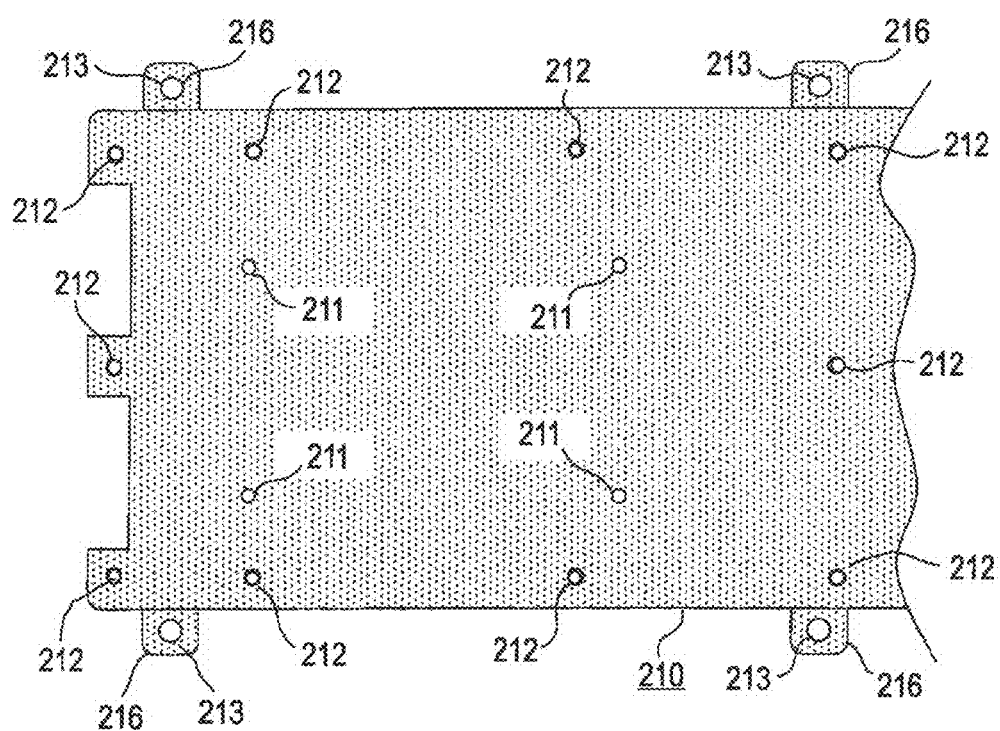
FIG. 19 is a plan view of abase in the electronic control device of FIG. 15.

A plurality of positioning pins 211 described below referring to FIG. 19 are provided to be erect in the base 210, and the positioning pins 211 are fitted into the pairs of positioning holes 254, 256, and 258, thereby regulating the attachment plane position of the control unit 250.

Next, in FIG. 17 which is a sectional view of the control signal connector 280 in the electronic control device 200, contact terminal portions 281a which are one end of a plurality of first wiring conductors 281 are molded integrally with the control signal connector 280 mounted on the cover 260 or are press-fitted into and held by press-fitting body portions 286, and pressed contact portions 281c which are the other end of a plurality of first wiring conductors 281 are aligned and integrated by a divided resin molded body 282a. The pressed contact portions 281c are provided with protrusions 281d. The pressed contact portions 281c are connected to the contact terminal portions 281a through bending deformation portions 281b. The protrusions 281d of the pressed contact portions 281c are brought into press-contact with the input/output control terminals 257a provided on the front surface of the circuit board 252 through the divided resin molded body 282a and a first pressing elastic mat 230b.

A plurality of first wiring conductors 284 constituted by contact terminal portions 284a and pressed contact portions 284c are molded integrally with or press-fitted into and fixed to the control signal connector 280. The pressed contact portions 284c which are the other end of a plurality of first wiring conductors 284 are aligned and integrated by a divided resin molded body 282b. The pressed contact portions 284c are connected to the contact terminal portions 284a through bending deformation portions 284b. Protrusions 284d of the pressed contact portions 284c are brought into press-contact with the input/output control terminals 257c provided on the front surface of the circuit board 252 through the divided resin molded body 282b and the first pressing elastic mat 230b.

The control signal connector 280 is fitted into and fixed to a connector window hole 264 (see FIG. 18) of the cover 260 using a detachment prevention hook 287 and a waterproof sealing material 288.

Next, in FIG. 18 which is an exploded configuration diagram of the electronic control device 200, the cover 260 constituting the electronic control device 200 is provided with a plurality of bag holes 261 into which a plurality of positioning pins 211 described below referring to FIG. 19 are fitted, a plurality of bolt through holes (not shown) through which the first fixing members 91 pass, the connector window hole 264 through which the control signal connector 280 passes, a plurality of heat dissipation ribs (not shown) which are provided for heat dissipation, and a second air pressure adjustment window (not shown) described above referring to FIGS. 8A to 8D.

The first interior packing 220b is provided with a plurality of bolt through holes (not shown) through which the first fixing members 91 pass, and an air pressure adjustment film (not shown) described above referring to FIGS. 8A to 8D.

First fitting portions 226 are provided at four corners of the first interior packing 220b, and fitting protrusions (not shown) provided at four corners of the annular peripheral wall member 240 are fitted into the first fitting portions 226, thereby regulating the attachment position of the first interior packing 220b to the cover 260. The height of the fitting protrusions is lower than the dimension after compression of the first interior packing 220b.

The first pressing elastic mat 230b is integrally constituted by a plurality of pin through holes (not shown) through which the positioning pins 211 pass, an elastic mat member 235b which presses the second resin molded body 46b of the additional wiring conductors 45, an elastic mat member 236b which presses the first resin molded body 46a of the additional wiring conductors 45, an elastic mat member 237b which presses the divided resin molded body 282a provided in the pressed contact portions of the first wiring conductors 281, and an elastic mat member 238b which presses the divided resin molded body 282b provided in the pressed contact portions 284c of the first wiring conductors 284.

The protrusions 45d in a plurality of additional wiring conductors 45 are brought into press-contact with the input/output control terminals 255a of the circuit board 252 through the first resin molded body 46a and the elastic mat member 236b of the first pressing elastic mat 230b. The protrusions 45x provided at the other end 45c of a plurality of additional wiring conductors 45 or provided in the pressed contact portions 248c (see FIG. 15) of the additional external terminals 248 are brought into press-contact with the mating surfaces through the second resin molded body 46b and the elastic mat member 235b of the first pressing elastic mat 230b.

The annular peripheral wall member 240 is provided with a first air pressure adjustment window (not shown). The cover 260 is provided with a second air pressure adjustment window (not shown) at a position facing the first air pressure adjustment window. The first interior packing 220b is provided with an air pressure adjustment film between the first air pressure adjustment window and the second air pressure adjustment window.

The press-contact pedestals 48c made of resin are arranged on the rear surface of the circuit board 252 corresponding to the input/output control terminals 257a and the input/output control terminals 257c.

A second pressing elastic mat 230a is integrally constituted by a plurality of pin through holes (not shown) through which the positioning pins 211 pass, an elastic mat member 236a which presses a divided resin molded body 246 of the second wiring conductors 245, and elastic mat members 237a and 238a which press the press-contact pedestals 48c. The second interior packing 220a is provided with a plurality of bolt through holes (not shown) through which the first fixing members 91 pass.

Second fitting portions 227 are provided at four corners of the second interior packing 220a, and fitting protrusions (not shown) provided at four corners of the base 210 are fitted into the second fitting portions 227, thereby regulating the attachment position of the second interior packing 220a to the base 210. The height of the fitting protrusions is lower than the dimension after compression of the second interior packing 220a.

Figure 18:
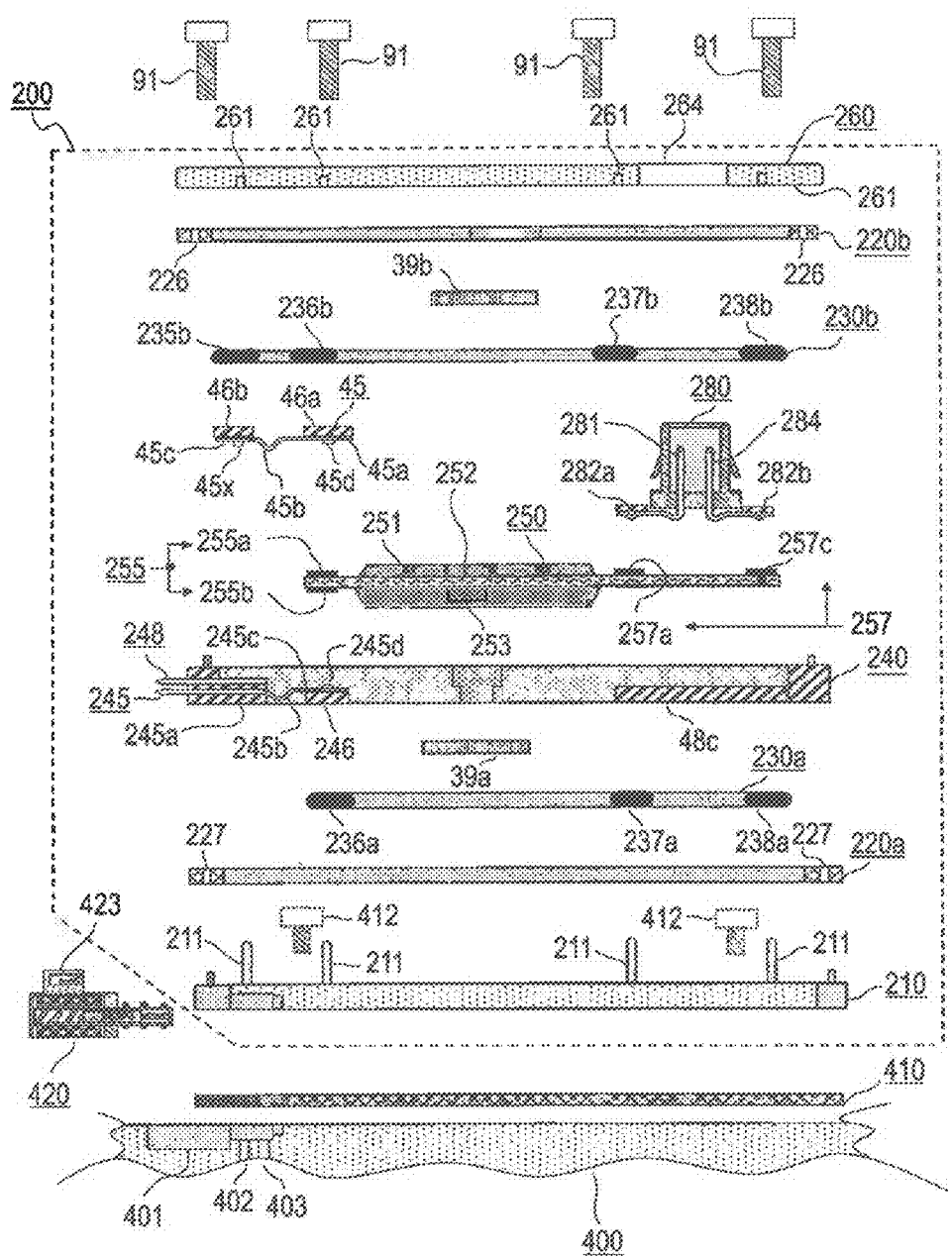
FIG. 18 is an exploded configuration diagram of the electronic control device of FIG. 15.

In FIGS. 18 and 19, a plurality of positioning pins 211 are fitted into and fixed to the base 210 constituting the electronic control device 200. A plurality of screw holes 212 into which the first fixing members 91 are screwed, and a plurality of unloaded holes 213 through which second fixing members 412 pass are provided in attachment legs 216.

Major differences between the electronic control device 100 of Embodiment 1 and the electronic control device 200 of Embodiment 2 are arranged as follows.

A first difference is that the configuration of the input/output control terminals 257 of the control unit 250 is different, and two rows of front terminals are provided.

As a result, the structure of the control signal connector 280 changes, and the press-contact pedestals 48c are used instead of the additional wiring conductors 45.

A second difference is that the additional external terminals 248 do not protrude from the bottom wall of the annular peripheral wall member 240, and pass through the inside and outside of the annular peripheral wall member 240 in a linear shape.

As a result, a signal from the input sensor inside the actuator 400 is extracted outside the actuator 400 once and is then connected to the electronic control device 200.

A third difference is that the positioning pins 211 are provided on the base 210 side, and the bag holes into which the positioning pins 211 are fitted are provided on the cover 260 side.

As a result, the assembly procedure of the electronic control device 200 changes and the respective members are laminated and arranged in order from the base 210.

A fourth difference is that the attachment legs 216 are provided in the base 210, and the cover 260 can be opened in a state where the base 210 is attached to the actuator 400.

(2) Detailed Description of Action and Operation

Input/output signals which are handled by the electronic control device 200 according to Embodiment 2 will be described comprehensively. The control signal connector 280 having the first wiring conductors 281 and 284 is connected to, for example, an engine control device to be a host controller (not shown), and the control unit 250 receives control power and a control command signal and performs a control operation to report and return the control state to the engine control device.

Although a gear shift sensor which detects the selection position of a gear shift lever is provided near the electronic control device 200 to be a transmission control device, in this embodiment, these input signals which are commonly used in the engine control device and the transmission control device outside the actuator 400 to be an automatic transmission are input to the engine control device once and are transmitted from the engine control device to the transmission control device through the control signal connector 280.

In regards to the input/output control terminals 255 and 257 of the circuit board 252 in this application, the copper foil patterns are used as they are without using wire-bonded relay terminals. For this reason, double-sided terminals are easily obtained, and it is possible to secure a required number of terminals even when the terminal width is widened, to improve contact reliability, and to move the terminals on the rear surface to the front surface by widening the circuit board surface.

Therefore, since it is not necessary to provide the additional wiring conductors 44 in the electronic control device 100, the pressing conductive contact surface is reduced and contact reliability is improved.

Although the input/output equipment 420 which is connected to the second wiring conductors 245 provided in the annular peripheral wall member 240 is the same as in Embodiment 1, the additional external terminals 248 pass through and protrude from the outer surface of the circumferential wall of the annular peripheral wall member 240, as an input sensor, such as a hydraulic sensor, a temperature sensor, or a rotation sensor provided inside an automatic transmission, a type of inserting and fixing a sensor head from the wall surface of the storage container of the actuator 400 is used.

The assembly procedure of the electronic control device 200 configured as above will be described. First, the second interior packing 220a, the second pressing elastic mat 230a, the second elastic holding mat 39a, the annular peripheral wall member 240, the press-contact pedestals 48c, the control unit 250, the additional wiring conductors 45, the control signal connector 280, the first elastic holding mat 39b, the first pressing elastic mat 230b, the first interior packing 220b, and the cover 260 are sequentially laminated and assembled in this order while being guided by the positioning pins 211 in a state where the inner surface of the base 210 turns toward the ceiling. The cover 260 and the base 210 are fastened and fixed by the blockade screws 91 as the first fixing members. Thus, the assembly of the electronic control device 200 is completed.

However, the second interior packing 220a performs mutual positioning by the second fitting portions 227 provided at the four corners thereof and the fitting protrusions (not shown) provided at the four corners of the base 210, and the first interior packing 220b performs mutual positioning by the first fitting portions 226 provided at the four corners thereof and the fitting protrusions (not shown) provided at the four corners of the annular peripheral wall member 240.

Therefore, the relative position of the conductive contact surface is regulated by the positioning pins, an assembly dimension error does not occur, and assembly work is performed in a simple assembly line unaccompanied by welding work.

When attaching the electronic control device 200 to the actuator 400, the base 210 is separately fixed by the second fixing members 412 through the exterior packing 410.

Therefore, in this embodiment, since it is possible to open only the cover 260 separately, the entire electronic control device 200 may not be detached from the actuator 400 in order to detach the control unit 250.

During disassembly work, the pressing force of the conductive contact surface is automatically released only by opening the cover 260, and during reassembly, since it should suffice that the respective components are laminated and arranged while being guided by the positioning pins 211, an assembly dimension error does not occur.

In a practical operation, since the elastic deformation portion and the bending deformation portion are provided in each wiring conductor, sliding wear of the conductive contact surface due to expansion and contraction caused by fluctuation in temperature does not occur.

(3) Main Points and Features of Embodiment 2

As will be apparent from the above description, the electronic control device 200 according to Embodiment 2 of the invention includes the control unit 250 which has a plurality of input/output control terminals 255 and 257 provided on the circuit board 252 with the electronic components 253 mounted thereon. In the electronic control device 200, the control unit 250 communicates a control signal with the host controller through the input/output control terminals 257 and the control signal connector 280, and controls the actuator 400 to be control-target equipment through the input/output control terminals 255 and the input/output connector 423. The second wiring conductors 245 in contact with the input/output control terminals 255 to connect the input/output control terminals and the input/output connector 423, the first wiring conductors 281 and 284 in contact with the input/output control terminals 257 to connect the input/output control terminals and the control signal connector 280, and the control unit 250 are stored in a region surrounded by the annular peripheral wall member 240, the base 210 covering one side of the annular peripheral wall member, and the cover 260 covering the other side of the annular peripheral wall member. The first interior packing 220b is interposed between the cover 260 and the annular peripheral wall member 240. The second interior packing 220a is interposed between the base 210 and the annular peripheral wall member 240. The first pressing elastic mat 230b which presses the contact portions between the input/output control terminals 257 and the first wiring conductors 281 and 284 from the inner surface of the cover 260, and the second pressing elastic mat 230a which presses the contact portions between the input/output control terminals 255 and the second wiring conductors 245 from the inner surface of the base 210 are arranged.

The cover 260, the base 210, and the annular peripheral wall member 240 are fastened and fixed to one another by at least the first fixing members 91. The cover 260 and the base 210 are fastened to each other by the first fixing members 91. In this way, the cover 260, the first interior packing 220b, the annular peripheral wall member 240, the second interior packing 220a, and the base 210 are fastened in a sealed state. The input/output control terminals 255 and the second wiring conductors 245 are brought into elastic contact with each other by the second pressing elastic mat 230a. The input/output control terminals 257 and the first wiring conductors 281 and 284 are brought into elastic contact with each other by the first pressing elastic mat 230b. The first interior packing 220b and the second interior packing 220a are non-adhesive elastic packings. If the cover 260 is opened, the input/output control terminals 255 and 257, the second wiring conductors 245, and the first wiring conductors 281 and 284 are separated from one another, such that the control unit 250 can be detached. The relative positions of the input/output control terminals 255 and 257, the second wiring conductors 245, and the first wiring conductors 281 and 284 are regulated by the positioning pins 211 protruding from the base 210.

The circuit board 252 with the electronic components 253 mounted thereon is sealed airtight by sealing resin to be the exterior body 251. The left side or the right side of the circuit board 252 is exposed from the exterior body 251, and a plurality of copper foil patterns to be the input/output control terminals 255 and 257 are generated on at least one of the front surface and the rear surface of the exposed substrate surface. The external terminal portions 245a which are one end of a plurality of second wiring conductors 245 are molded integrally with the annular peripheral wall member 240 made of a resin molding material, are exposed outside the annular peripheral wall member, and are connected to the input/output connector 423. The pressed contact portions 245c which are the other end of a plurality of second wiring conductors 245 are integrally molded by the divided resin molded body 246 and aligned and arranged. The pressed contact portions 245c are provided with the protrusions 245d. The pressed contact portions 245c are connected to the external terminal portions 245a through the elastic deformation portions 245b. The protrusions 245d of the pressed contact portions 245c are brought into press-contact with the input/output control terminals 255b provided on the rear surface of the circuit board 252 through the divided resin molded body 246 and the second pressing elastic mat 230a.

As above, in relation to a third aspect of the invention, the second wiring conductors are constituted by the external terminal portions, the elastic deformation portions, and the pressed contact portions having the protrusions, the external terminal portions are molded integrally with the annular peripheral wall member, and the pressed contact portions are integrally molded by the divided resin molded body and are in contact with the rear surface of the circuit board.

Therefore, as in Embodiment 1, since the conductive contact surface to the circuit board is only one surface, and a plurality of conductive contact surfaces are not provided, it is possible to prevent degradation of contact reliability.

Since the second wiring conductors are integrated with the annular peripheral wall member in advance, assembly work is facilitated, and thermal expansion and contraction of the wiring conductors are absorbed by the elastic deformation portions, whereby it is possible to prevent the occurrence of sliding wear of the pressing contact portions.

In the annular peripheral wall member 240, the additional external terminals 248 constituted by the external terminal portions 248a and the pressed contact portions 248c are integrally molded. The external terminal portions 248a pass through the outer circumferential wall of the annular peripheral wall member 240. The signal lines connected to the input sensors inside and outside the actuator 400 are connected to the external terminal portions 248a. The input/output control terminals 255a provided on the front surface of the circuit board 252 are connected to the pressed contact portions 248c of the additional external terminals 248 through a plurality of additional wiring conductors 45. One end 45a of a plurality of additional wiring conductors 45 is aligned and integrated by the first resin molded body 46a, and the other end 45c of a plurality of additional wiring conductors 45 is aligned and integrated by the second resin molded body 46b. The elastic deformation portions 45b are provided in the intermediate portions of a plurality of additional wiring conductors 45 communicating the first and second resin molded bodies 46a and 46b. The protrusions 45x provided at the other end 45c of a plurality of additional wiring conductors 45 or provided in the pressed contact portions 248c of the additional external terminals 248 are brought into press-contact with the mating surfaces through the second resin molded body 46b and the first pressing elastic mat 230b.

As above, in relation to a fifth aspect of the invention, one end and the other end of a plurality of additional wiring conductors which are connected to signal lines connected to input sensors inside and outside the actuator are aligned and integrated by the first and second resin molded bodies, the first and second exposed surfaces from the molded bodies are brought into press-contact with the input/output control terminals on the front surface of the circuit board and the additional external terminals, and the elastic deformation portions are provided in the intermediate portions of a plurality of wiring conductors communicating the first and second resin molded bodies.

Therefore, while the additional wiring conductors contact on two surfaces of the conductive contact surface to the circuit board and the conductive contact surface to the external terminal portions, in case of a safety circuit which requires advanced contact reliability, it is possible to connect a plurality of load wiring conductors in parallel or to widen the terminal width to widen a contact area, and to obtain many input/output control terminals with space saving by effectively using the input/output control terminals provided on both surfaces of the circuit board.

Since a plurality of additional wiring conductors are aligned and integrated by the first and second resin molded bodies in advance, assembly work is facilitated, and thermal expansion and contraction of the wiring conductors are absorbed by the elastic deformation portions, whereby it is possible to prevent the occurrence of sliding wear of the pressing contact portions.

The circuit board 252 with the electronic components 253 mounted thereon is sealed airtight by sealing resin to be the exterior body 251. The left side or the right side of the circuit board 252 is exposed from the exterior body 251, and a plurality of copper foil patterns to be the input/output control terminals 255 and 257 are generated on at least one of the front surface and the rear surface of the exposed substrate surface. The contact terminal portions 281a and 284a which are one end of a plurality of first wiring conductors 281 and 284 are molded integrally with or press-fitted into and held by the control signal connector 280 mounted on the cover 260. The pressed contact portions 281c and 284c which are the other end of a plurality of first wiring conductors 281 and 284 are aligned and integrated by the divided resin molded bodies 282a and 282b. The pressed contact portions 281c and 284c are provided with the protrusions 281d and 284d. The pressed contact portions 281c and 284c are connected to the contact terminal portions 281a and 284a through the bending deformation portions 281b and 284b. The protrusions 281d and 284d of the pressed contact portions 281c and 284c are brought into press-contact with the input/output control terminals 257a and 257c provided on the front surface of the circuit board 252 through the divided resin molded bodies 282a and 282b and the first pressing elastic mat 230b.

As above, in relation to a seventh aspect of the invention, the first wiring conductors are constituted by the external terminal portions, the bending deformation portions, and the pressed contact portions having the protrusions, the external terminal portions are integrated with the control signal connector mounted on the cover, and the pressed contact portions are aligned and integrated by the divided resin molded body and are in contact with the front surface of the circuit board.

Therefore, as in Embodiment 1, since the conductive contact surface to the circuit board is only one surface, and a plurality of conductive contact surfaces are not provided, it is possible to prevent degradation of contact reliability.

Since the first wiring conductors are integrated with the control signal connector in advance, assembly work is facilitated, and the influence of thermal expansion and contraction of the wiring conductors is avoided by the bending deformation portions, whereby it is possible to prevent the occurrence of sliding wear of the pressing contact portions.

When the circuit board 252 has no connection conductors to the input/output control terminals on the rear surface, the press-contact pedestals 48c in contact with the positions on the rear surface corresponding to the input/output control terminals 257a and 257c on the front surface are arranged, and the press-contact pedestals 48c are pressed from the inner surface of the base 210 through the second pressing elastic mat 230a.

As above, in relation to a tenth aspect of the invention, when the circuit board has no input/output control terminals on the rear surface, the rear surface of the circuit board is pressed through the press-contact pedestals and the second pressing elastic mat.

Therefore, the circuit board is pressed evenly from the front surface and the rear surface, and is stably held at the intermediate position between the cover and the base.

The relative positions of the input/output control terminals 255 and 257, the second wiring conductors 245, and the first wiring conductors 281 and 284, or the additional external terminals 248 and the additional wiring conductors 45 are regulated by the positioning pins 211 protruding from the base 210. The cover 260 is provided with the bag holes 261 into which the positioning pins 211 are fitted. The openings of the bag holes 261 have a funnel shape. The effective fitting depth of the positioning pins 211 has dimension equal to or greater than the total press-compression dimension of the first pressing elastic mat 230b and the second pressing elastic mat 230a.

As above, in relation to a twelfth aspect of the invention, the relative positions of the input/output control terminals of the circuit board, the second wiring conductors, and the first wiring conductors, or the additional wiring conductors, the additional wiring terminals, and the additional external terminals are regulated by the positioning pins protruding from the base fitted into the bag holes provided in the cover.

Therefore, the second interior packing 220a, the second pressing elastic mat 230a, the second elastic holding mat 39a, the annular peripheral wall member 240, the press-contact pedestals 48c, the control unit 250, the additional wiring conductors 45, the control signal connector 280, the first elastic holding mat 39b, the first pressing elastic mat 230b, the first interior packing 220b, and the cover 260 are sequentially laminated and assembled in this order while being guided by the positioning pins 211 in a state where the inner surface of the base 210 turns toward the ceiling. The cover 260 and the base 210 are fastened and fixed by the blockade screws 91 as the first fixing members. Thus, the assembly of the electronic control device 200 is completed.

For this reason, the relative position of the conductive contact surface is regulated by the positioning pins, an assembly dimension error does not occur, and assembly work is performed in a simple assembly line unaccompanied by welding work.

Embodiment 3

(1) Detailed Description of Configuration

Hereinafter, an electronic control device 300 according to Embodiment 3 of the invention will be described in detail focusing on the difference from the electronic control device shown in FIG. 1.

In the respective drawings, the same reference numerals represent the same or similar portions, reference numerals 100s relate to Embodiment 1, reference numerals 300s relate to Embodiment 3, and two-digit reference numerals are reference numerals common to the respective embodiments.

Figure 20:
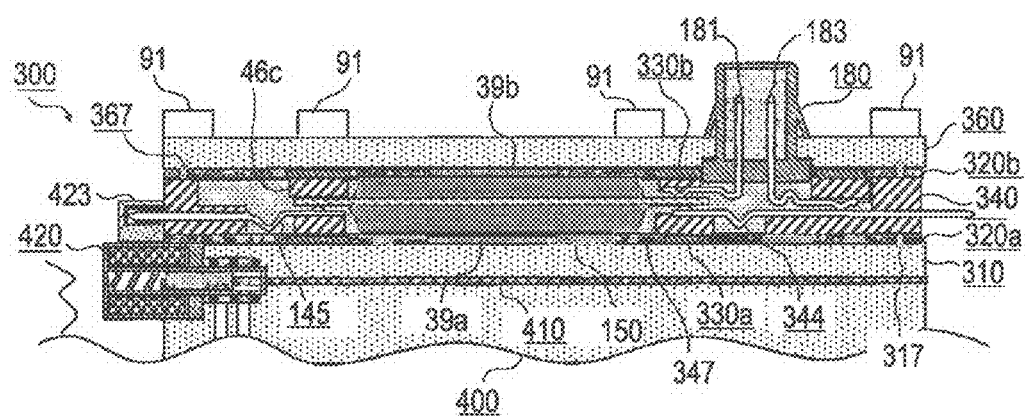
FIG. 20 is an overall configuration diagram of an electronic control device according to Embodiment 3 of the invention.

First, in FIG. 20 which is an overall configuration diagram of the electronic control device 300, similarly to the electronic control device 100, the electronic control device 300 primarily has, for example, an airtight housing constituted by a base 310 made of an aluminum die cast, an annular peripheral wall member 340 made of a resin molding material, and a cover 360 made of an aluminum die cast, and a control unit 150 stored in the airtight housing.

Figure 22:
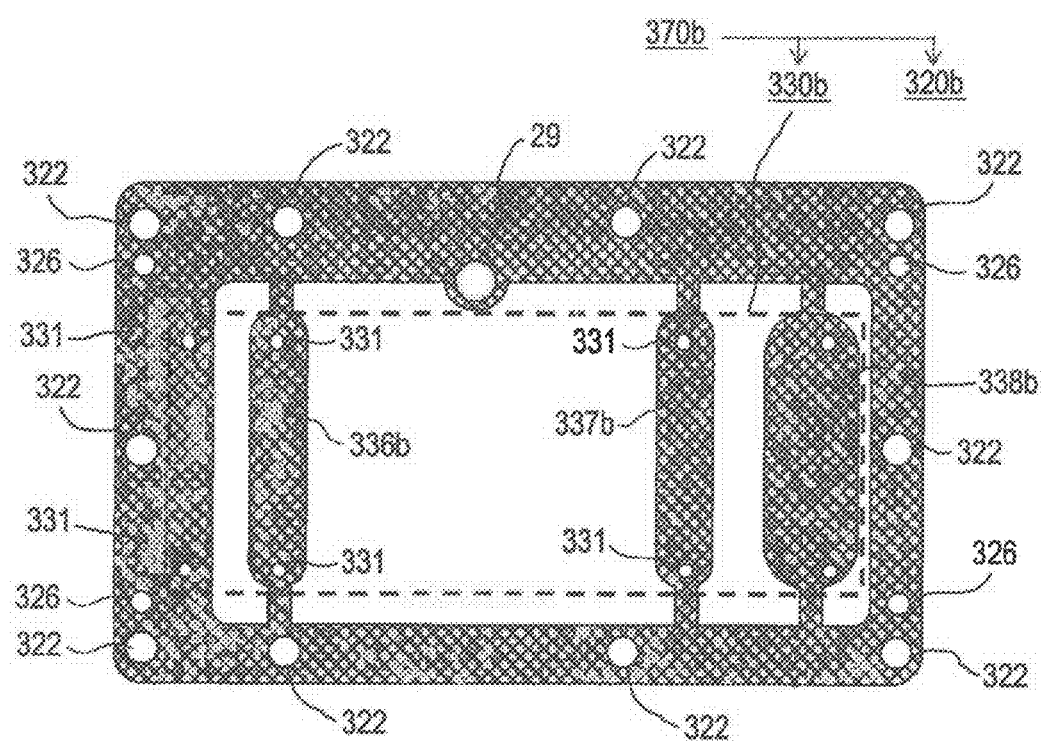
FIG. 22 is a plan view of a first packing and elastic mat in the electronic control device of FIG. 20.
Figure 23:
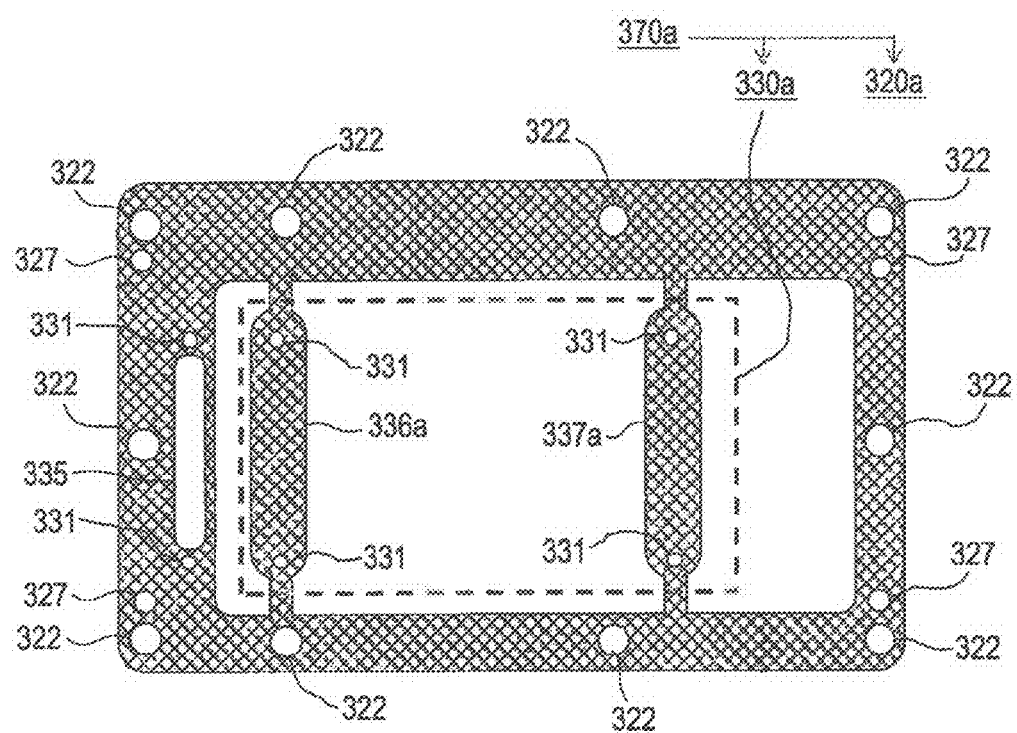
FIG. 23 is a plan view of a second packing and elastic mat in the electronic control device of FIG. 20.

A first packing and elastic mat 370b described below referring to FIG. 22 is interposed between the cover 360 and the annular peripheral wall member 340, a second packing and elastic mat 370a described below referring to FIG. 23 is interposed between the base 310 and the annular peripheral wall member 340, and the first packing and elastic mat 370b and the second packing and elastic mat 370a are co-fastened and integrated by a plurality of blockade screws as first fixing members 91.

The embedded control unit 150 is elastically held between the cover 360 and the base 310 through thermally conductive first and second elastic holding mats 39b and 39a.

In the annular peripheral wall member 340, a plurality of second wiring conductors 145 and additional wiring conductors 344 are integrally molded.

Next, in FIG. 21, which is an exploded configuration diagram of the electronic control device 300, the cover 360 constituting the electronic control device 300 is provided with a plurality of bag holes 361 into which a plurality of positioning pins 311 described below are fitted, a plurality of bolt through holes (not shown) through which the first fixing members 91 pass, a connector window hole 364 through which the control signal connector 280 passes, a plurality of heat dissipation ribs (not shown) which are provided for heat dissipation, and a second air pressure adjustment window (not shown) described above referring to FIGS. 8A to 8D. The cover 360 is also provided with a plurality of gap setting protrusions 367 for regulating the compression dimension of the first packing and elastic mat 370b.

Figure 21:
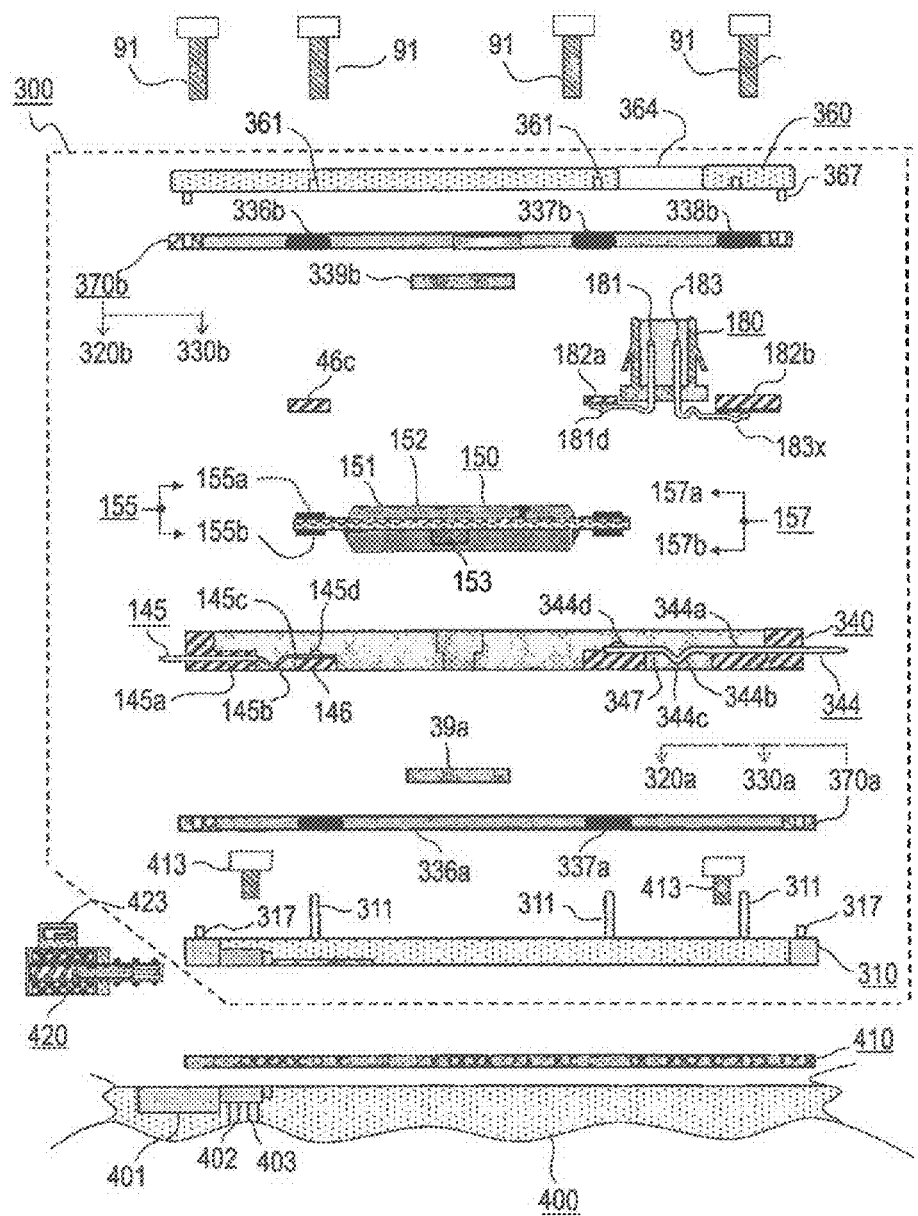
FIG. 21 is an exploded configuration diagram of the electronic control device of FIG. 20.

In FIG. 21 and FIG. 22 which is a plan view of the first packing and elastic mat 370b, a first interior packing 320b which is a part of the first packing and elastic mat 370b is provided with a plurality of bolt through holes 322 through which the first fixing members 91 pass, an air pressure adjustment film 29 described above referring to FIGS. 8A to 8D, and first fitting portions 326 into which the gap setting protrusions 367 are fitted.

The first pressing elastic mat 330b which is the remaining part of the first packing and elastic mat 370b is integrally constituted by a plurality of pin through holes 331 through which the positioning pins 311 pass, a elastic mat member 336b which presses press-contact pedestals 46c, an elastic mat member 337b which presses the divided resin molded body 182a provided in the pressed contact portions of the first wiring conductors 181, and an elastic mat member 338b which presses the divided resin molded body 182b provided in the pressed contact portions 183c of the additional wiring terminals 183.

Returning to FIG. 21, the annular peripheral wall member 340 is provided with a first air pressure adjustment window described above referring to FIGS. 8A to 8D, the cover 360 is provided with a second air pressure adjustment window (not shown) at a position facing the first air pressure adjustment window, and the first interior packing 320b is provided with an air pressure adjustment film 29 between the first air pressure adjustment window and the second air pressure adjustment window.

The press-contact pedestals 46c made of resin are arranged on the front surface of the circuit board 152 corresponding to the input/output control terminals 155b.

The additional wiring conductors 344 are constituted by external terminal portions 344a which pass through the circumferential wall portion of the annular peripheral wall member 340, elastic deformation portions 344b, and pressed contact portions 344c having protrusions 344d. The pressed contact portions 344c are aligned and integrated by a divided resin molded body 347.

In FIG. 21 and FIG. 23 which is a plan view of the second packing and elastic mat 370a, a second interior packing 320a which is a part of the second packing and elastic mat 370a is provided with a plurality of bolt through holes 322 through which the first fixing members 91 pass, and second fitting portions 327 into which gap setting protrusions 317 described below are fitted.

A second pressing elastic mat 330a which is the remaining part of the second packing and elastic mat 370a is integrally constituted by a plurality of pin through holes 331 through which the positioning pins 311 pass, an elastic mat member 336a which presses the divided resin molded body 146, and an elastic mat member 337a which presses the divided resin molded body 347.

Returning to FIG. 21, similarly to FIG. 19, a plurality of positioning pins 311 are fitted into and fixed to the base 310 constituting the electronic control device 300. A plurality of screw holes 312 (not shown) into which the first fixing members 91 are screwed, and a plurality of unloaded holes 313 (not shown) through which second fixing members 413 pass are provided in attachment legs 316.

Major differences between the electronic control device 100 of Embodiment 1 and the electronic control device 300 of Embodiment 3 are arranged as follows.

A first difference is that the first and second interior packings and the first and second pressing elastic mats are integrated and become first and second packing and elastic mats.

The packing and elastic mats may be applied to Embodiments 1 and 2, and conversely, in Embodiment 3, an interior packing and a pressing elastic mat may be separated and used.

A second different is that, the additional external terminals 148 are not provided, the additional wiring conductors 344 pass through the inside and outside of the annular peripheral wall member 340, and the additional wiring conductors 344 are connected to the additional wiring terminals 183 of the control signal connector 180.

As a result, signals from the input sensors inside and outside the actuator 400 are connected to the electronic control device 300 through the external terminal portions 344*a*.

A third difference is that the positioning pins 311 are provided on the base 310 side, and the bag holes into which the positioning pins 311 are fitted are provided on the cover 360 side.

As a result, the assembly procedure of the electronic control device 300 changes, and the respective members are laminated and arranged in order from the base 310.

The positioning pins may be changed from the cover to the base in Embodiment 1 or may be changed from the base to the cover in Embodiments 2 and 3.

A fourth difference is that the attachment legs 316 (not shown) are provided in the base 310, and the cover 360 can be opened in a state where the base 310 is attached to the actuator 400.

The attachment legs may be applied to Embodiment 1, and in Embodiments 2 and 3, the attachment legs may be disused and a attachment method of co-fastening the cover and the base may be used.

(2) Detailed Description of Action and Operation

Input/output signals which are handled by the electronic control device 300 according to Embodiment 3 will be described comprehensively. The control signal connector 180 having the first wiring conductors 181 and the additional wiring terminals 183 is connected to, for example, an engine control device to be a host controller (not shown), and the control unit 150 receives control power and a control command signal and performs a control operation to report and return the control state to the engine control device.

Although a gear shift sensor which detects the selection position of a gear shift lever is provided near the electronic control device 300 to be a transmission control device, and a temperature sensor, a hydraulic sensor, a rotation sensor, and the like are provided inside the actuator 400 as an automatic transmission, signals from these input sensors can be input from the additional wiring conductors 344 to the electronic control device 300 and the engine control device.

Therefore, since it is not necessary to provide the additional wiring conductors 44 in the electronic control device 100, the pressing conductive contact surfaces connected in series are reduced and contact reliability is improved.

That is, the signals from the input sensors connected to the external terminal portions 344*a* of the additional wiring conductors 344 can be connected to the input/output control terminals 157*b* of the control unit 150, and can also be transmitted to the host controller through the additional wiring terminals 183 of the control signal connector 180.

Although the input/output equipment 420 which is connected to the second wiring conductors 145 provided in the annular peripheral wall member 340 is the same as in Embodiment 1, the additional external terminals 148 are removed, and a signal from an input sensor inside the actuator 400 is input to the control unit 150 through the second wiring conductors 145 or the additional wiring conductors 344.

The assembly procedure of the electronic control device 300 configured as above will be described. First, the second interior packing 320*a*, the second pressing elastic mat 330*a*, the second elastic holding mat 39*a*, the annular peripheral wall member 340, the control unit 150, the press-contact pedestals 46*c*, the control signal connector 180, the first elastic holding mat 39*b*, the first pressing elastic mat 330*b*, the first interior packing 320*b*, and the cover 360 are sequentially laminated and assembled in this order while being guided by the positioning pins 311 in a state where the inner surface of the base 310 turns toward the ceiling. The cover 360 and the base 310 are fastened and fixed by the blockade screws 91 as the first fixing members. Thus, the assembly of the electronic control device 300 is completed.

However, in Embodiment 3, the second packing and elastic mat 370*a* is used for the second interior packing 320*a* and the second pressing elastic mat 330*a*, and the first packing and elastic mat 370*b* is used for the first interior packing 320*b* and the first pressing elastic mat 330*b*.

The second interior packing 320*a* performs mutual positioning by the second fitting portions 327 provided at the four corners thereof and second gap setting protrusions 317 provided at four corners of the base 310, and the first interior packing 320*b* performs mutual positioning by the first fitting portions 326 provided at the four corners thereof and the first gap setting protrusions 367 provided at the four corners of the cover 360 in advance.

Therefore, the relative position of the conductive contact surface is regulated by the positioning pins, an assembly dimension error does not occur, and assembly work is performed in a simple assembly line unaccompanied by welding work.

When attaching the electronic control device 300 to the actuator 400, the base 310 is separately fixed by the second fixing members 413 through the exterior packing 410.

Therefore, in this embodiment, since it is possible to open only the cover 360 separately, the entire electronic control device 300 may not be detached from the actuator 400 in order to detach the control unit 150.

During disassembly work, the pressing force of the conductive contact surface is automatically released only by opening the cover 360, and during reassembly, since it should suffice that the respective components are laminated and arranged while being guided by the positioning pins 311, an assembly dimension error does not occur.

In a practical operation, since the elastic deformation portion and the bending deformation portion are provided in each wiring conductor, sliding wear of the conductive contact surface due to expansion and contraction caused by fluctuation in temperature does not occur.

(3) Main Points and Features of Embodiment 3

As will be apparent from the above description, the electronic control device 300 according to Embodiment 3 of the invention includes the control unit 150 which has a plurality of input/output control terminals 155 and 157 provided on the circuit board 152 with the electronic components 153 mounted thereon. In the electronic control device 300, the control unit 150 communicates a control signal with the host controller through the input/output control terminals 157 and the control signal connector 180, and controls the actuator 400 to be control-target equipment through the input/output control terminals 155 and the input/output connector 423. The second wiring conductors 145 in contact with the input/output control terminals 155 to connect the input/output control terminals and the input/output connector 423, the first wiring conductors 181 in contact with the input/output control terminals 157 to connect the input/output control terminals and the control signal connector 180, and the control unit 150 are stored in a region surrounded by the annular peripheral wall member 340, the base 310 covering one side of the annular peripheral wall member, and the cover 360 covering the other side of the annular peripheral wall member. The first interior packing 320b is interposed between the cover 360 and the annular peripheral wall member 340. The second interior packing 320a is interposed between the base 310 and the annular peripheral wall member 340. The first pressing elastic mat 330b which presses the contact portions between the input/output control terminals 157 and the first wiring conductors 181 from the inner surface of the cover 360, and the second pressing elastic mat 330a which presses the contact portions between the input/output control terminals 155 and the second wiring conductors 145 from the inner surface of the base 310 are arranged.

The cover 360, the base 310, and the annular peripheral wall member 340 are fastened and fixed to one another by at least the first fixing members 91. The cover 360 and the base 310 are fastened to each other by the first fixing members 91. In this way, the cover 360, the first interior packing 320b, the annular peripheral wall member 340, the second interior packing 320a, and the base 310 are fastened in a sealed state. The input/output control terminals 155 and the second wiring conductors 145 are brought into elastic contact with each other by the second pressing elastic mat 330a. The input/output control terminals 157 and the first wiring conductors 181 are brought into elastic contact with each other by the first pressing elastic mat 330b. The first interior packing 320b and the second interior packing 320a are non-adhesive elastic packings. If the cover 360 is opened, the input/output control terminals 155 and 157, the second wiring conductors 145, and the first wiring conductors 181 are separated from one another, such that the control unit 150 can be detached. The relative positions of the input/output control terminals 155 and 157, the second wiring conductors 145, and the first wiring conductors 181 are regulated by the positioning pins 311 protruding from the base 310.

The circuit board 152 with the electronic components 153 mounted thereon is sealed airtight by sealing resin to be the exterior body 151. The left side or the right side of the circuit board 152 is exposed from the exterior body 151, and a plurality of copper foil patterns to be the input/output control terminals 155 and 157 are generated on at least one of the front surface and the rear surface of the exposed substrate surface. The external terminal portions 145a which are one end of a plurality of second wiring conductors 145 are molded integrally with the annular peripheral wall member 340 made of a resin molding material, are exposed outside the annular peripheral wall member, and are connected to the input/output connector 423. The pressed contact portions 145c which are the other end of a plurality of second wiring conductors 145 are integrally molded by the divided resin molded body 146 and aligned and arranged. The pressed contact portions 145c are provided with the protrusions 145d. The pressed contact portions 145c are connected to the external terminal portions 145a through the elastic deformation portions 145b. The protrusions 145d of the pressed contact portions 145c are brought into press-contact with the input/output control terminals 155b provided on the rear surface of the circuit board 152 through the divided resin molded body 146 and the second pressing elastic mat 330a.

As above, in relation to a third aspect of the invention, the second wiring conductors are constituted by the external terminal portions, the elastic deformation portions, and the pressed contact portion having the protrusions, the external terminal portions are molded integrally with the annular peripheral wall member, and the pressed contact portions are integrally molded by the divided resin molded body and are in contact with the rear surface of the circuit board.

Therefore, as in Embodiment 1, since the conductive contact surface to the circuit board is only one surface, and a plurality of conductive contact surfaces are not provided, it is possible to prevent degradation of contact reliability.

Since the second wiring conductors are integrated with the annular peripheral wall member in advance, assembly work is facilitated, and thermal expansion and contraction of the wiring conductors are absorbed by the elastic deformation portions, whereby it is possible to prevent the occurrence of sliding wear of the pressing contact portions.

When the circuit board 152 has no connection conductors to the input/output control terminals on the front surface, the press-contact pedestals 46c in contact with the positions on the front surface corresponding to the input/output control terminals 155b on the rear surface are arranged, and the press-contact pedestals 46c are pressed from the inner surface of the cover 360 through the first pressing elastic mat 330b.

As above, in relation to a sixth aspect of the invention, when the circuit board has no input/output control terminals on the front surface, the front surface of the circuit board is pressed through the press-contact pedestals and the first pressing elastic mat.

Therefore, the circuit board is pressed evenly from the front surface and the rear surface, and is stably held at the intermediate position between the cover and the base.

The circuit board 152 with the electronic components 153 mounted thereon is sealed airtight by sealing resin to be the exterior body 151. The left side or the right side of the circuit board 152 is exposed from the exterior body 151, and a plurality of copper foil patterns to be the input/output control terminals 155 and 157 are generated on at least one of the front surface and the rear surface of the exposed substrate surface. The contact terminal portions 181a which are one end of a plurality of first wiring conductors 181 are molded integrally with or press-fitted into and held by the control signal connector 180 mounted on the cover 360. The pressed contact portions 181c which are the other end of a plurality of first wiring conductors 181 are aligned and integrated by the divided resin molded body 182a. The pressed contact portions 181c are provided with the protrusions 181d. The pressed contact portions 181c are connected to the contact terminal portions 181a through the bending deformation portions 181b. The protrusions 181d of the pressed contact portions 181c are brought into press-contact with the input/output control terminals 157a provided on the front surface of the circuit board 152 through the divided resin molded body 182a and the first pressing elastic mat 330b.

As above, in relation to a seventh aspect of the invention, the first wiring conductors are constituted by the external terminal portions, the elastic deformation portions, and the pressed contact portions having the protrusions, the external terminal portions are integrated with the control signal connector mounted on the cover, and the pressed contact portions are aligned and integrated by the divided resin molded body and are in contact with the front surface of the circuit board.

Therefore, as in Embodiment 1, since the conductive contact surface to the circuit board is only one surface, and a plurality of conductive contact surfaces are not provided, it is possible to prevent degradation of contact reliability.

Since the first wiring conductors are integrated with the control signal connector in advance, assembly work is facilitated, and the influence of thermal expansion and contraction of the wiring conductors is avoided by the bending deformation portions, whereby it is possible to prevent the occurrence of sliding wear of the pressing contact portions.

A plurality of additional wiring terminals 183 constituted by the contact terminal portions 183a and the pressed contact portions 183c are molded integrally with or press-fitted into and fixed to the control signal connector 180. The pressed contact portions 183c which are the other end of a plurality of additional wiring terminals 183 are aligned and integrated by the divided resin molded body 182b. The pressed contact portions 183c are connected to the contact terminal portions 183a through the bending deformation portions 183b. A plurality of additional wiring conductors 344 constituted by the external terminal portions 344a and the pressed contact portions 344c are molded integrally with the annular peripheral wall member 340. The external terminal portions 344a pass through the inside and outside of the outer circumferential wall of the annular peripheral wall member 340. The signal lines connected to the input sensors provided outside the annular peripheral wall member 340 are connected to the outside portions of the external terminal portions 344a inside and outside the actuator 400. The protrusions 183x provided in the pressed contact portions 183c of the additional wiring terminals 183 or provided in the inside portions of the external terminal portions 344a of the additional wiring conductors 344 are brought into press-contact with the mating surfaces through the divided resin molded body 182b and the first pressing elastic mat 330b. The pressed contact portions 344c of the additional wiring conductors 344 are aligned and integrated by the divided resin molded body 347 and are connected to the external terminal portions 344a through the elastic deformation portions 344b. The protrusions 344d provided in the pressed contact portions 344c are brought into press-contact with the input/output control terminals 157b on the rear surface of the circuit board 152 through the divided resin molded body 347 and the second pressing elastic mat 330a. Two or all of the external input sensors, the additional wiring terminals 183, or the input/output control terminals 157b are connected to a plurality of additional wiring conductors 344 to perform signal communication with each other.

As above, in relation to a ninth aspect of the invention, a plurality of additional wiring conductors which are connected to the signal lines connected to the input sensors inside and outside the actuator have the external terminal portions molded integrally with the annular peripheral wall member, and the pressed contact portions connected through the elastic deformation portions and aligned and integrated by the divided resin molded body, and two or all of the external input sensors, the additional wiring terminals of the control signal connector, or the input/output control terminals of the control unit are connected to a plurality of additional wiring conductors to perform signal communication with each other.

Therefore, it is possible to perform common signal communication among the host controller connected outside the control signal connector, the external input sensors, and the control unit.

The conductive contact surface to the circuit board, the input sensors, and the control signal connector and the conductive contact surface to the input sensors and the control signal connector are only one surface, and since a plurality of conductive contact surfaces connected in series are not provided, it is possible to prevent degradation of contact reliability.

Since the additional wiring conductors are integrated with the annular peripheral wall member in advance, assembly work is facilitated, and the influence of thermal expansion and contraction of the wiring conductors is avoided by the elastic deformation portions and the bending deformation portions, whereby it is possible to prevent the occurrence of sliding wear of the pressing contact portions.

The relative positions of the input/output control terminals 155 and 157, the second wiring conductors 145, and the first wiring conductors 181, or the additional wiring conductors 344 and the additional wiring terminals 183 are regulated by the positioning pins 311 protruding from the base 310. The cover 360 is provided with the bag holes 361 into which the positioning pins 311 are fitted. The openings of the bag holes 361 have a funnel shape. The effective fitting depth of the positioning pins 311 has dimension equal to or greater than the total press-compression dimension of the first pressing elastic mat 330b and the second pressing elastic mat 330a.

As above, in relation to a twelfth aspect of the invention, the relative positions of the input/output control terminals of the circuit board, the second wiring conductors, and the first wiring conductors, or the additional wiring conductors and the additional wiring terminals are regulated by the positioning pins protruding from the base fitted into the bag holes provided in the cover.

Therefore, the second interior packing 320a, the second pressing elastic mat 330a, the second elastic holding mat 39a, the annular peripheral wall member 340, the control unit 150, the press-contact pedestals 46c, the control signal connector 180, the first elastic holding mat 39b, the first pressing elastic mat 330b, the first interior packing 320b, and the cover 360 are sequentially laminated and assembled in this order while being guided by the positioning pins 311 in a state where the inner surface of the base 310 turns toward the ceiling. The cover 360 and the base 310 are fastened and fixed by the blockade screws 91 as the first fixing members. Thus, the assembly of the electronic control device 300 is completed.

However, in Embodiment 3, the second packing and elastic mat 370a is used for the second interior packing 320a and the second pressing elastic mat 330a, and the first packing and elastic mat 370b is used for the first interior packing 320b and the first pressing elastic mat 330b.

For this reason, the relative position of the conductive contact surface is regulated by the positioning pins, an assembly dimension error does not occur, and assembly work is performed in a simple assembly line unaccompanied by welding work.

The first gap setting protrusions 367 are arranged on one counter surface of the cover 360 and the annular peripheral wall member 340, and the second gap setting protrusions 317 are arranged on one counter surface of the base 310 and the annular peripheral wall member 340. The first pressing elastic mat 330b and the second pressing elastic mat 330a, and the first interior packing 320b and the second interior packing 320a are at least separate bodies of the same material or are integrated to be the first packing and elastic mat 370b and the second packing and elastic mat 370a. The first packing and elastic mat 370b is provided with the first fitting portions 326 which avoid contact with the first gap setting protrusions 367. The second packing and elastic mat 370a is provided with the second fitting portions 327 which avoid contact with the second gap setting protrusions 317. When the blockade screws as the first fixing members 91 are fastened with predetermined torque, the compressive deformation amount of the first and second packing and elastic mats 370*b* and 370*a* has predetermined dimension which is regulated by the first and second gap setting protrusions 367 and 317. The contact pressure of the conductive contact surface is regulated by the compressive deformation amount.

As above, in relation to a fourteenth aspect of the invention, when the cover and the base are fastened and fixed by the first fixing members, the compressive deformation amount of the first and second packing and elastic mats has predetermine dimension which is regulated by the gap setting protrusions.

Therefore, the functions as the first and second interior packings are determined by compression dimension obtained by subtracting the height of the first and second gap setting protrusions from the material thickness of the first and second packing and elastic mats. The functions as the first and second pressing elastic mats are determined by compression dimension from when the first and second packing and elastic mats start to come into contact with the pressing surface until the fastening of the first and second fixing members is completed. For this reason, the compression dimension increases, whereby it is possible to suppress a fluctuation error of a pressing force due to a dimension error of each portion.

It is possible to freely set the thickness of a portion corresponding to an interior packing and the thickness of a portion corresponding to a pressing elastic mat, and to achieve reduction in the number of components and reduction in the number of mold surfaces by integration.

In Embodiments 1 to 3, the base 110; 210; 310 is fastened and fixed to the attachment surface provided in the storage container of the actuator 400 by the second fixing members 411; 412; 413. The second fixing members 411; 412; 413 fasten and fix the base 110; 210; 310 to the storage container separately, or co-fasten and fix the whole of the cover 160; 260; 360, the annular peripheral wall member 140; 240; 340, and the base 110; 210; 310 to the storage container.

As above, in relation to a twentieth aspect of the invention, the second fixing members attach and fix the single base or the whole of the base, the annular peripheral wall member, and the cover to the storage container of the actuator.

Therefore, when the second fixing members attach and fix the single base, the internal control unit can be detached by removing the first fixing members in a state where the electronic control device is attached to the actuator, thereby increasing convenience of disassembly and inspection.

When the second fixing members double as a part of the first fixing members, while the control unit can be detached by removing the second fixing members to detach the electronic control device from the actuator and then removing the first fixing members, the attachment legs are not required in the base, and the number of fixing screws is reduced.

Various modifications and alterations of this invention will be apparent to those skilled in the art without departing from the scope and spirit of this invention, and it should be understood that this is not limited to the illustrative embodiments set forth herein.

In the respective drawings, the same reference numerals represent the same or similar portions.

What is claimed is:
1. An electronic control device comprising:
   a control unit which has a plurality of input/output control terminals provided on a circuit board with electronic components mounted thereon,
   wherein the control unit communicates a control signal with a host controller through an input/output control terminal and a control signal connector and controls an actuator to be control-target equipment through the input/output control terminals and an input/output connector,
   second wiring conductors in contact with the input/output control terminals to connect the input/output control terminals and the input/output connector, first wiring conductors in contact with the input/output control terminals to connect the input/output control terminals and the control signal connector, and the control unit are stored in a region surrounded by an annular peripheral wall member, a base covering one side of the annular peripheral wall member, and a cover covering the other side of the annular peripheral wall member,
   a first interior packing is interposed between the cover and the annular peripheral wall member, a second interior packing is interposed between the base and the annular peripheral wall member, a first pressing elastic mat which presses contact portions between the input/output control terminals and the first wiring conductors from the inner surface side of the cover and a second pressing elastic mat which presses contact portions between the input/output control terminals and the second wiring conductors from the inner surface side of the base are arranged, the cover, the base, and the annular peripheral wall member are fastened and fixed to one another by at least first fixing members, and the cover and the base are fastened to each other by the first fixing members, such that the cover, the first interior packing, the annular peripheral wall member, the second interior packing, and the base are fastened in a sealed state, and
   the input/output control terminals and the second wiring conductors are brought into elastic contact with each other by the second pressing elastic mat, the input/output control terminals and the first wiring conductors are brought into elastic contact with each other by the first pressing elastic mat,
   the first interior packing and the second interior packing are non-adhesive elastic packings, if the cover is opened, the input/output control terminals, the second wiring conductors, and the first wiring conductors are separated from one another to detach the control unit, and the relative positions of the input/output control terminals and the second wiring conductors, and the relative positions of the input/output control terminals and the first wiring conductors are regulated by positioning pins protruding from the cover or positioning pins protruding from the base.
2. The electronic control device according to claim 1,
   wherein the annular peripheral wall member is made of a resin molding material, the cover and the base are made of a metal material subjected to molding or sheet metal working, the first fixing members elastically hold an exterior body constituting the control unit between the cover and the base through a thermally conductive first elastic holding mat in contact with the inner surface of the cover and a thermally conductive second elastic holding mat in contact with the inner surface of the base, and the hardness of the first elastic holding mat and the second elastic holding mat is soft compared to the hardness of the first pressing elastic mat and the second pressing elastic mat.

3. The electronic control device according to claim 1,
wherein the circuit board with the electronic components mounted thereon is sealed airtight by sealing resin to be an exterior body, the left side or a right side of the circuit board is exposed from the exterior body, and a plurality of copper foil patterns to be the input/output control terminals are generated on at least one of the front surface and the rear surface of the exposed substrate surface, and external terminal portions which are one end of the plurality of second wiring conductors are molded integrally with the annular peripheral wall member made of the resin molding material, are exposed outside the annular peripheral wall member, and are connected to the input/output connector, pressed contact portions which are the other end of the plurality of second wiring conductors are integrally molded by a divided resin molded body and aligned and arranged, the pressed contact portions are provided with protrusions, the pressed contact portions are connected to the external terminal portions through elastic modification portions, and the protrusions of the pressed contact portions are brought into press-contact with the input/output control terminals provided on the rear surface of the circuit board through the divided resin molded body and the second pressing elastic mat.

4. The electronic control device according to claim 3,
wherein additional external terminals constituted by external terminal portions and pressed contact portions orthogonal to each other are integrally molded in the annular peripheral wall member, the external terminal portions pass through the bottom wall of the annular peripheral wall member, pass through wiring window holes provided in the second interior packing, wiring window holes provided in the base, and wiring window holes of an exterior packing arranged on the outer surface of the base, and are inserted into a storage container of the actuator, an input sensor in the storage container is connected to the tips of the external terminal portions through a connector usable in oil, and the input/output control terminals provided on the front surface of the circuit board are connected to the pressed contact portions of the additional external terminals through a plurality of additional wiring conductors, and one end of the plurality of additional wiring conductors is aligned and integrated by a first resin molded body, the other end of the plurality of additional wiring conductors is aligned and integrated by a second resin molded body, elastic deformation portions are provided in the intermediate portions of the plurality of additional wiring conductors communicating the first and second resin molded bodies, protrusions provided at one end of the plurality of additional wiring conductors are brought into press-contact with the input/output control terminal on the front surface of the circuit board through the first resin molded body and the first pressing elastic mat, and protrusions provided at the other end of the plurality of additional wiring conductors or provided in the pressed contact portions of the additional external terminals are brought into press-contact with mating surfaces through the second resin molded body and the first pressing elastic mat.

5. The electronic control device according to claim 3,
wherein additional external terminals constituted by external terminal portions and pressed contact portions are integrally molded in the annular peripheral wall member, the external terminal portions pass through the outer circumferential wall of the annular peripheral wall member, signal lines connected to input sensors inside and outside an actuator are connected to the external terminal portions, input/output control terminals provided on the front surface of the circuit board are connected to the pressed contact portions of the additional external terminals through a plurality of additional wiring conductors, one end of the plurality of additional wiring conductors is aligned and integrated by a first resin molded body, the other end of the plurality of additional wiring conductors is aligned and integrated by a second resin molded body, elastic deformation portions are provided in the intermediate portions of the plurality of additional wiring conductors communicating the first and second resin molded bodies, and protrusions provided at the other end of the plurality of additional wiring conductors or provided in the pressed contact portions of the additional external terminals are brought into press-contact with mating surfaces through the second resin molded body and the first pressing elastic mat.

6. The electronic control device according to claim 3,
wherein, when the circuit board has no connection conductors to the input/output control terminal on the front surface, press-contact pedestals in contact with the front surface positions corresponding to the input/output control terminals on the rear surface are arranged, and the press-contact pedestals are pressed from the inner surface of the cover through the first pressing elastic mat.

7. The electronic control device according to claim 1,
wherein the circuit board with the electronic components mounted thereon is sealed airtight by sealing resin to be an exterior body, the left side or the right side of the circuit board is exposed from the exterior body, a plurality of copper foil patterns to be the input/output control terminals are generated on at least one of the front surface and the rear surface of the exposed substrate surface, contact terminal portions which are one end of the plurality of first wiring conductors are molded integrally with or press-fitted to and held by the control signal connector mounted on the cover, pressed contact portions which are the other end of the plurality of first wiring conductors are aligned and integrated by a divided resin molded body, the pressed contact portions are provided with protrusions, the pressed contact portions are connected to the contact terminal portions through bending deformation portions, and the protrusions of the pressed contact portions are brought into press-contact with input/output control terminals provided on the front surface of the circuit board through the divided resin molded body and the first pressing elastic mat.

8. The electronic control device according to claim 7,
wherein, in the control signal connector, a plurality of additional wiring terminals constituted by contact terminal portions and pressed contact portions are integrally molded or press-fitted and fixed, pressed contact portions which are the other end of the plurality of additional wiring terminals are aligned and integrated by a divided resin molded body, the pressed contact portions are connected to the contact terminal portions through bending deformation portions, input/output control terminals provided on the rear surface of the circuit board are connected to the pressed contact portions of the additional wiring terminals through a plurality of additional wiring conductors, one end of the plurality of additional wiring conductors is aligned and integrated by a first resin molded body, the other end of the plurality of additional wiring conductors is aligned and integrated by a second resin molded body, elastic deformation portions are provided in the intermediate portions of the plurality of additional wiring conductors communicating the first and second resin molded bodies, protrusions provided at the other end of the plurality of additional wiring conductors are brought into press-contact with input/output control terminals on the rear surface of the circuit board through the second resin molded body and the second pressing elastic mat, and protrusions provided at one end of the plurality of additional wiring conductors or provided in the pressed contact portions of the additional wiring terminals are brought into press-contact with mating surfaces through the divided resin molded body and the first pressing elastic mat.

9. The electronic control device according to claim 7, wherein, in the control signal connector, a plurality of additional wiring terminals constituted by contact terminal portions and pressed contact portions are integrally molded or press-fitted and fixed, the pressed contact portions which are the other end of the plurality of additional wiring terminals are aligned and integrated by a divided resin molded body, the pressed contact portions are connected to the contact terminal portions through bending deformation portions, a plurality of additional wiring conductors constituted by external terminal portions and pressed contact portions are integrally molded in the annular peripheral wall member, the external terminal portions pass through the inside and outside of the outer peripheral wall of the annular peripheral wall member, and signal lines connected to an input sensor provided outside the annular peripheral wall member are connected to the outside portions of the external terminal portions inside and outside the actuator, and protrusions provided in the pressed contact portions of the additional wiring terminals or in the inside portions of the external terminal portions of the additional wiring conductors are brought into press-contact with mating surfaces through the divided resin molded body and the first pressing elastic mat, pressed contact portions of the additional wiring conductors are aligned and integrated by a divided resin molded body and are connected to the external terminal portions through the elastic deformation portions, protrusions provided in the pressed contact portions are brought into press-contact with input/output control terminals on the rear surface of the circuit board through the divided resin molded body and the second pressing elastic mat, and the external input sensor or two or all of the additional wiring terminals or the input/output control terminal are connected to each of the plurality of additional wiring conductors so as to perform signal communication.

10. The electronic control device according to claim 7, wherein, when the circuit board has no connection conductors to the input/output control terminals on the rear surface, press-contact pedestals in contact with the rear surface positions corresponding to the input/output control terminals on the front surface are arranged, and the press-contact pedestals are pressed from the inner surface of the base through the second pressing elastic mat.

11. The electronic control device according to claim 1, wherein the relative positions of the input/output control terminals, the second wiring conductors, and the first wiring conductors, or additional wiring conductors, additional external terminals, and additional wiring terminals are regulated by the positioning pins protruding from the cover, bag holes into which the positioning pins are fitted are provided in the base, the openings of the bag holes have a funnel shape, and the effective fitting depth of the positioning pins has dimension equal to or greater than the total press-compression dimension of the first pressing elastic mat and the second pressing elastic mat.

12. The electronic control device according to claim 1, wherein the relative positions of the input/output control terminals, the second wiring conductors, and the first wiring conductors, or additional wiring conductors, additional external terminals, and additional wiring terminals are regulated by positioning pins protruding from the base, bag holes into which the positioning pins are fitted are provided in the cover, the openings of the bag holes have a funnel shape, and the effective fitting depth of the positioning pins has dimension equal to or greater than the total press-compression dimension of the first pressing elastic mat and the second pressing elastic mat.

13. The electronic control device according to claim 1, wherein the thickness and hardness of the first pressing elastic mat and the second pressing elastic mat are greater and softer than the first interior packing and the second interior packing, when blockade screws as the first fixing members are fastened with predetermined torque, the compressive deformation amount of the first interior packing and the second interior packing is small and the compressive deformation amount of the first pressing elastic mat and the second pressing elastic mat is large, and the contact pressure of a conductive contact surface is regulated by the compressive deformation amount.

14. The electronic control device according to claim 1, wherein first gap setting protrusions are arranged on one counter surface of the cover and the annular peripheral wall member, second gap setting protrusions are arranged on one counter surface of the base and the annular peripheral wall member, the first pressing elastic mat and the second pressing elastic mat, and the first interior packing and the second interior packing are at least separate bodies of the same material or are integrated to be a first packing and elastic mat and a second packing and elastic mat, first fitting portions which avoid contact with the first gap setting protrusions are provided in the first packing and elastic mat, second fitting portions which avoid contact with the second gap setting protrusions are provided in the second packing and elastic mat, when blockade screws as the first fixing members are fastened with predetermined torque, the compressive deformation amount of the first and second packing and elastic mats has predetermined dimension which is regulated by the first and second gap setting protrusions, and the contact pressure of a conductive contact surface is regulated by the compressive deformation amount.

15. The electronic control device according to claim 13, wherein a first air pressure adjustment window is provided in the annular peripheral wall member, a second air pressure adjustment window is provided in the cover at a position facing the first air pressure adjustment window, and an air pressure adjustment film which is a thin-film expansible portion, a spherical movable portion, or a wavelike movable portion between the first air pressure adjustment window and the second air pressure adjustment window is provided in the first interior packing.

16. The electronic control device according to claim 14, wherein a first air pressure adjustment window is provided in the annular peripheral wall member, a second air pressure adjustment window is provided in the cover at a position facing the first air pressure adjustment window, and an air pressure adjustment film which is a thin-film expansible portion, a spherical movable portion, or a wavelike movable portion between the first air pressure adjustment window and the second air pressure adjustment window is provided in the first interior packing.

17. The electronic control device according to claim 1, wherein the pressed contact portions of the second wiring conductors have tip portions bent in an orthogonal direction, the orthogonal bent portions are fitted into groove holes provided in the divided resin molded body to constitute protrusions in conductive contact with input/output control terminals on the rear surface of the circuit board, an elastic mat member which is a part of the second pressing elastic mat is interposed between the divided resin molded body and the base, and an additional elastic mat member having hardness lower than the second pressing elastic mat is interposed between the second wiring conductors and the divided resin molded body.

18. The electronic control device according to claim 1, wherein the pressed contact portions of the second wiring conductors have tip portions folded in a U-shaped direction, the U-shaped folded portions become elastic deformation members protruding outside a divided resin molded body to constitute protrusions in conductive contact with input/output control terminals on the rear surface of the circuit board in the tip portions of the U-shaped folded portions, and an elastic mat member which is apart of the second pressing elastic mat is interposed between the divided resin molded body and the base.

19. The electronic control device according to claim 1, wherein concave bent portions double bent in a concave shape are provided in the pressed contact portions of the second wiring conductors, the concave bent portions become elastic deformation members protruding outside a divided resin molded body to constitute protrusions in conductive contact with input/output control terminals on the rear surface of the circuit board in the tip portions of the concave bent portions, the tip portions are arranged with connection members made of a resin material molded simultaneously with the divided resin molded body fitted into the concave bent portions, and an elastic mat member which is a part of the second pressing elastic mat is interposed between the divided resin molded body and the base.

20. The electronic control device according to claim 1, wherein a conductive gel material to be protrusions in conductive contact with input/output control terminals on the rear surface of the circuit board is applied to the pressed contact portions of the second wiring conductors, and an elastic mat member which is a part of the second pressing elastic mat is interposed between a divided resin molded body and the base.

21. The electronic control device according to claim 1, wherein the base is fastened and fixed to an attachment surface provided in a storage container of the actuator by a second fixing member, and the second fixing member fastens and fixes the base to the storage container separately or co-fastens and fixes the whole of the cover, the annular peripheral wall member, and the base to the storage container.

* * * * *